United States Patent
Omura

(10) Patent No.: US 6,556,353 B2
(45) Date of Patent: Apr. 29, 2003

(54) PROJECTION OPTICAL SYSTEM, PROJECTION EXPOSURE APPARATUS, AND PROJECTION EXPOSURE METHOD

(75) Inventor: Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/028,733

(22) Filed: Dec. 28, 2001

(65) Prior Publication Data

US 2003/0063393 A1 Apr. 3, 2003

(30) Foreign Application Priority Data

Feb. 23, 2001 (JP) ........................................ 2001-049330
Aug. 24, 2001 (JP) ........................................ 2001-254683

(51) Int. Cl.$^7$ ................................................. G02B 3/00
(52) U.S. Cl. ..................... 359/649; 359/754; 359/763; 359/770; 359/7
(58) Field of Search ............................... 359/754–770, 359/649

(56) References Cited

U.S. PATENT DOCUMENTS

| | | | |
|---|---|---|---|
| 4,948,238 A | 8/1990 | Araki | 359/708 |
| 5,117,255 A | 5/1992 | Shiraishi et al. | 355/53 |
| 5,253,110 A | 10/1993 | Ichihara et al. | 359/619 |
| 5,260,832 A | 11/1993 | Togino et al. | 359/679 |
| 5,424,552 A | 6/1995 | Tsuji et al. | 250/548 |
| 5,473,410 A | 12/1995 | Nishi | 355/53 |
| 5,477,304 A | 12/1995 | Nishi | 355/53 |
| 5,636,000 A | 6/1997 | Ushida et al. | 355/30 |
| 5,781,278 A | 7/1998 | Matsuzawa et al. | 355/53 |
| 5,805,344 A | 9/1998 | Sasaya et al. | 359/649 |
| 5,808,814 A | 9/1998 | Kudo | 359/740 |
| 5,831,770 A | 11/1998 | Matsuzawa et al. | 359/649 |

(List continued on next page.)

FOREIGN PATENT DOCUMENTS

| | | |
|---|---|---|
| EP | 1 006 373 A2 | 6/2000 |
| EP | 1 006 387 A2 | 6/2000 |
| EP | 1 006 388 A2 | 6/2000 |
| EP | 1 037 267 A1 | 9/2000 |
| EP | 1 061 396 A2 | 12/2000 |
| EP | 1 094 350 A2 | 4/2001 |
| EP | 1 111 425 A2 | 6/2001 |
| EP | 1 139 138 A1 | 10/2001 |
| EP | 1 164 399 A2 | 12/2001 |
| JP | A-1-198759 | 8/1989 |
| JP | A-4-127514 | 4/1992 |
| JP | A-4-192317 | 7/1992 |

(List continued on next page.)

*Primary Examiner*—Georgia Epps
*Assistant Examiner*—M. Hasan
(74) *Attorney, Agent, or Firm*—Oliff & Berridge PLC

(57) ABSTRACT

A dioptric projection optical system projects an image of a first surface onto a second surface and includes a first lens group having a negative refractive power and arranged in an optical path between the first surface and the second surface, a second lens group having a positive refractive power and arranged in an optical path between the first lens group and the second surface, a third lens group having a negative refractive power and arranged in an optical path between the second lens group and the second surface, a fourth lens group having an aperture stop and arranged in an optical path between the third lens group and the second surface, and a fifth lens group having a positive refractive power and arranged in an optical path between the fourth lens group and the second surface, wherein lens components belonging to the dioptric projection optical system are formed of at least two types of fluorides, and wherein a clear aperture of a light beam in the projection optical system is at a relative maximum within the second lens group, is at a minimum within the third lens group, and is at a relative maximum within the third, fourth, or fifth lens group, and has only one significant minimum between the first surface and the second surface.

22 Claims, 10 Drawing Sheets

U.S. PATENT DOCUMENTS

| | | | |
|---|---|---|---|
| 5,831,776 A | 11/1998 | Sasaya et al. | 359/754 |
| 5,835,285 A | 11/1998 | Matsuzawa et al. | 359/754 |
| 5,850,300 A | 12/1998 | Kathman et al. | 359/9 |
| 5,852,490 A | 12/1998 | Matsuyama | 359/754 |
| 5,856,884 A | 1/1999 | Mercado | 359/649 |
| 5,903,400 A | 5/1999 | Endo | 359/758 |
| 5,943,172 A | 8/1999 | Sasaya et al. | 359/754 |
| 5,956,182 A | 9/1999 | Takahashi | 359/649 |
| 5,990,926 A | 11/1999 | Mercado | 347/258 |
| 6,008,884 A | 12/1999 | Yamaguchi et al. | 359/649 |
| 6,084,723 A | 7/2000 | Matsuzawa et al. | 359/649 |
| 6,088,171 A | 7/2000 | Kudo | 510/117 |
| 6,104,544 A | 8/2000 | Matsuzawa et al. | 359/649 |
| 6,198,576 B1 | 3/2001 | Matsuyama | 359/754 |
| 6,259,508 B1 | 7/2001 | Shigematsu | 355/53 |
| 6,295,119 B1 | 9/2001 | Suzuki | 355/53 |
| 6,333,781 B1 | 12/2001 | Shigematsu | 355/71 |
| 6,341,007 B1 | 1/2002 | Nishi et al. | 355/53 |
| 6,349,005 B1 | 2/2002 | Schuster et al. | 359/754 |
| 2001/0012099 A1 | 8/2001 | Kumagai | 359/649 |
| 2002/0001141 A1 * | 1/2002 | Shafer et al. | 359/649 |
| 2002/0005938 A1 | 1/2002 | Omura | 359/649 |

FOREIGN PATENT DOCUMENTS

| | | |
|---|---|---|
| JP | A-4-196513 | 7/1992 |
| JP | A-5-34593 | 2/1993 |
| JP | A-5-41344 | 2/1993 |
| JP | A-5-173065 | 7/1993 |
| JP | A-5-175098 | 7/1993 |
| JP | A-6-84527 | 3/1994 |
| JP | A-6-313845 | 11/1994 |
| JP | A-7-128592 | 5/1995 |
| JP | A-8-305034 | 11/1996 |
| JP | A-8-330220 | 12/1996 |
| JP | A-10-79345 | 3/1998 |
| JP | A-10-163098 | 6/1998 |
| JP | A-10-197791 | 7/1998 |
| JP | A-10-214783 | 8/1998 |
| JP | A-10-284408 | 10/1998 |
| JP | A-10-325922 | 12/1998 |
| JP | A-10-333030 | 12/1998 |
| JP | A-11-95095 | 4/1999 |
| JP | A-11-133301 | 5/1999 |
| JP | A-11-174365 | 7/1999 |
| JP | A-11-297612 | 10/1999 |
| JP | A-11-297620 | 10/1999 |
| JP | A-11-352398 | 12/1999 |
| JP | P2000-56218 A | 2/2000 |
| JP | P2000-56219 A | 2/2000 |
| JP | P2000-121933 A | 4/2000 |
| JP | P2000-121934 A | 4/2000 |
| JP | P2000-131607 A | 5/2000 |
| JP | P2000-133588 A | 5/2000 |
| JP | P2000-137162 A | 5/2000 |
| JP | P2000-182952 A | 6/2000 |
| JP | P2000-199850 A | 7/2000 |
| JP | P2000-231058 A | 8/2000 |
| JP | P2000-249917 A | 9/2000 |
| JP | P2000-356741 A | 12/2000 |
| JP | P2000-357645 A | 12/2000 |
| JP | P2001-23887 A | 1/2001 |
| JP | P2001-51193 A | 2/2001 |
| WO | WO 00/33138 | 6/2000 |
| WO | WO 00/70407 | 11/2000 |
| WO | WO 01/50171 | 7/2001 |

* cited by examiner

PROJECTION OPTICAL SYSTEM, PROJECTION EXPOSURE APPARATUS, AND PROJECTION EXPOSURE METHOD

BACKGROUND OF THE INVENTION

1. Field of the Invention

This invention relates to a projection exposure apparatus and a projection exposure method which are used, for example, when a micro device such as a semiconductor integrated circuit, an imaging element such as a CCD or the like, a liquid crystal display, a thin film magnetic head, or the like is fabricated by using lithography technology, and to a projection optical system which is suitable for use in the projection exposure apparatus.

2. Related Background Art

Recently, as circuit patterns of micro devices such as semiconductor integrated circuits and the like have been made smaller, a wavelength of illumination light (exposure light) for exposure which is used in an exposure apparatus such as a stepper has been shortened. That is, as exposure light, instead of an i line (wavelength: 365 nm) of a mercury lamp which was mainly used in a conventional device, KrF excimer laser light (wavelength: 248 nm) is mainly used. Furthermore, ArF excimer laser light which has an even shorter wavelength (wavelength: 193 nm) has been made practical. Additionally, with the object of developing exposure light of a short wavelength, use of halogen molecular laser or the like such as $F_2$ laser (wavelength: 157 nm) is also being tested.

As a light source at a wavelength 200 nm or less in a vacuum ultraviolet region, the above-mentioned excimer laser, halogen molecular laser, or the like can be used. However, there is a limit to practically developing a narrow band in such lasers. Additionally, materials which transmit radiated light in a vacuum ultraviolet region are limited, so only limited materials can be used for the lens elements which constitute the projection optical system. The transmittance of these limited materials is not very high. Furthermore, currently, performance capability of antireflection coatings provided on a surface of the lens elements is not as high as in long wavelength light.

SUMMARY OF THE INVENTION

Therefore, one object of this invention is to have a short glass path length and a low number of lens surfaces, to suitably correct chromatic aberration, and to reduce a burden of a light source. Furthermore, another object of this invention is to suitably project and expose an image of a pattern of a mask which has been made extremely fine onto a workpiece.

To accomplish the above-mentioned objects, a projection optical system of a first embodiment is a dioptric projection optical system which projects an image of a first surface onto a second surface, includes lens components formed of at least two types of fluorides, and is constituted by, in order from the first surface side, a first lens group having a negative refractive power, a second lens group having a positive refractive power, a third lens group having a negative refractive power, a fourth lens group having an aperture stop within an optical path, and a fifth lens group having a positive refractive power. An clear aperture of a light beam in the projection optical system is at a maximum within the second lens group, is at a minimum within the third lens group, is at a relative maximum within the third, fourth, or fifth lens groups, and has only one significant minimum between the first surface and the second surface.

Additionally, in order to accomplish the above-mentioned object, the projection optical system of a second embodiment is a dioptric projection optical system which projects an image of a first surface onto a second surface and is constituted by, in order from the first surface side, a first lens group having a negative refractive power, a second lens group having a positive refractive power, a third lens group having a negative refractive power, a fourth lens group having an aperture stop within an optical path, and a fifth lens group having a positive refractive power. When an clear aperture of a light beam in the projection optical system monotonically increases within the first lens group in the direction from the first surface side to the second surface side, the clear aperture of the light beam goes from an increased size to a decreased size within the second lens group, the clear aperture goes from a decreased size to an increased size within the third lens group, the clear aperture monotonically decreases within the fifth lens group, the clear aperture of a surface having the maximum clear aperture within the second lens group is Mx2, and the clear aperture of a surface having the minimum clear aperture within the third lens group is Mn3, and the following condition is satisfied:

$$1.7 < Mx2/Mn3 < 4.$$

Additionally, in order to accomplish the above-mentioned object, a projection exposure apparatus according to this invention is a projection exposure apparatus which projection exposes an image of a pattern arranged in a mask onto a workpiece, is provided with a light source which supplies exposure light, an illumination optical system which guides exposure light from the light source to the pattern on the mask, and the projection optical system, and can arrange the mask at the first surface and the workpiece at the second surface. Furthermore, in preferred embodiments of the projection exposure apparatus of this invention, the light source supplies exposure light in a vacuum ultraviolet region, and in further preferred embodiments, the light source includes an $F_2$ laser.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
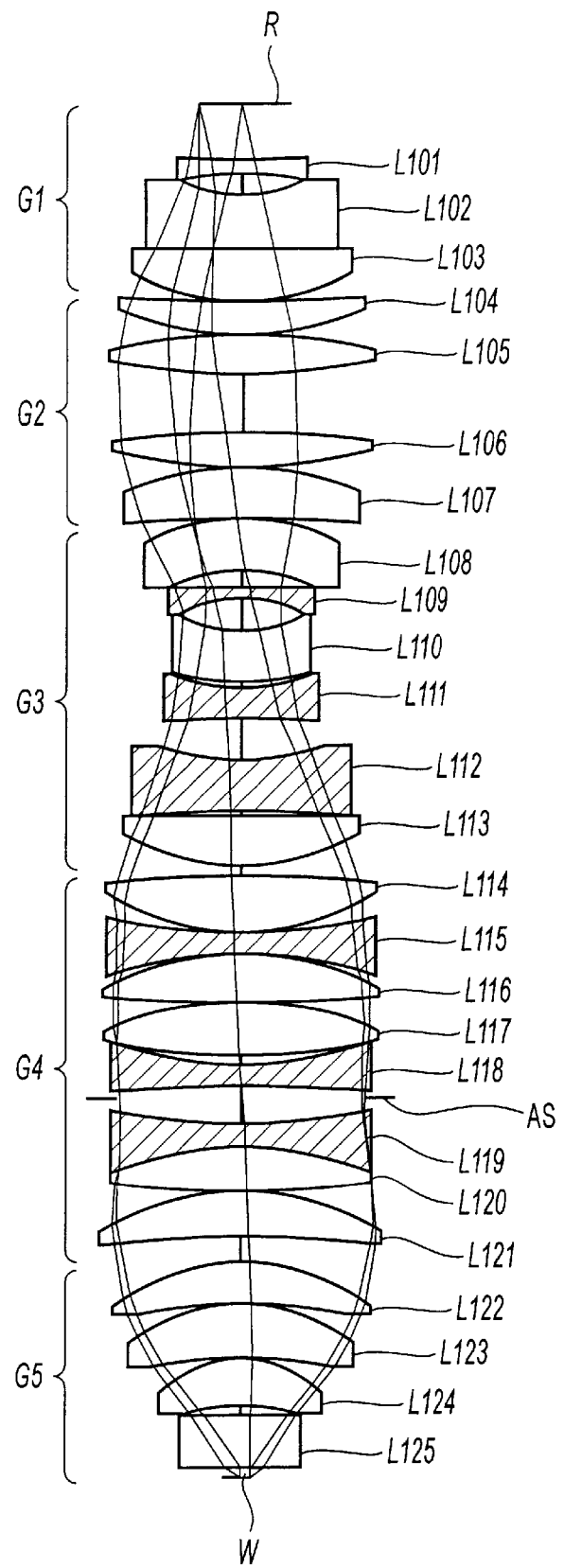
FIG. 1 is an optical path diagram of a projection optical system of a first embodiment of this invention.

The following explains details of embodiments of this invention based on the drawings. FIGS. 1–4 are optical path diagrams of a projection optical system related to first through fourth embodiments of this invention. The projection optical systems shown in FIGS. 1–4 are dioptric projection optical systems which project a reduced image of a pattern image on a reticle R as a first surface onto a wafer W as a second surface. These projection optical systems include lens components formed of at least two types of fluorides and are constituted by, in order from the first surface side, a first lens group G1 having a negative refractive power, a second lens group G2 having a positive refractive power, a third lens group G3 having a negative refractive power, a fourth lens group G4 having an aperture stop in an optical path, and a fifth lens group G5 having a positive refractive power.

Additionally, an clear aperture of a light beam in the projection optical system is at a relative maximum within the second lens group G2, is at a minimum within the third lens group G3, is at a relative maximum within the third, fourth or fifth lens group G3, G4, or G5, respectively, and has only one prominence minimum between the first surface and the second surface.

Because at least two types of fluorides are used as lens components of the projection optical system, the refractive optical members are constituted by materials with different dispersions, so chromatic aberration can be corrected well. Therefore, even when a light source whose narrow band area is not well developed is used, a high imaging performance capability can be accomplished. Furthermore, by having a lens structure in which the only one significant minimum is held between the first and second surfaces, the number of lenses can be reduced. Therefore, a glass path length can be shortened, and the number of lens surfaces can be reduced. By so doing, requirement levels for performance capability of transmittance and reflection prevention coatings can be reduced, and a projection optical system can be easily fabricated.

Furthermore, it is preferable that all lens components within these dioptric projection optical systems are formed of at least two types of fluorides. Fluoride has sufficient transmittance with respect to wavelengths of 200 nm or less, so absorption of exposure light of a refractive optical member within the projection optical system can be reduced to a degree where there is substantially no effect. Furthermore, when composite silica is used as a lens material, generation of irradiation fluctuation due to absorption of exposure light occurs. However, if fluoride is used as a material, this can be avoided. Furthermore, because of the above-mentioned construction, an optical system in which chromatic aberration which can correspond to $F_2$ laser light is corrected.

Additionally, when an clear aperture of a surface having the maximum clear aperture within the second lens group is Mx2 and an clear aperture of a surface having the minimum clear aperture within the third lens group is Mn3, it is preferable that the following condition equation (1) is satisfied.

$$1.7 < Mx2/Mn3 < 4 \qquad (1)$$

When the maximum of the condition equation (1) is exceeded, correction of off-axis aberration becomes difficult, and if the minimum is exceeded, correction of chromatic aberration is not good. Additionally, preferable boundary values are maximum 3.2 and minimum 1.85.

Furthermore, this projection optical system is constituted by, in order from the first surface side, a first lens group having a negative refractive power, a second lens group having a positive refractive power, a third lens group having a negative refractive power, a fourth lens group having an aperture stop within an optical path, and a fifth lens group having a positive refractive power. Furthermore, the clear aperture of the light beam in the projection optical system monotonically increases within the first lens group from the first surface side to the second surface side, goes from an increased size to a decreased size within the second lens group, goes from a decreased size to an increased size from the third lens group, and monotonically decreases within the fifth lens group. According to the above-mentioned structure, the second and third lens groups can be caused to effectively contribute to Petzval's sum.

Furthermore, it is preferable that a combination of at least two sets of positive and negative lenses are adjacent in the fourth lens group and the positive and negative lenses are formed of different fluoride materials. The fourth lens group has an aperture stop, so chromatic aberration can be effectively corrected by arranging this type of lens in the vicinity of a pupil position. Additionally, correction of chromatic aberration can be well accomplished by a combination of positive and negative lenses formed of materials of different dispersions. By so doing, correction of chromatic aberration in a wide laser band area can be accomplished.

Additionally, it is preferable that the fluoride is a material selected from the group consisting of calcium fluoride, barium fluoride, lithium fluoride, magnesium fluoride, strontium fluoride, lithium.calcium.aluminum.fluoride, and lithium.strontium.aluminum.fluoride. Among fluorides, these fluoride crystals are materials that can be processed and fabricated into optical elements, and by selecting a material from this group, a projection optical system and an exposure apparatus can be easily fabricated.

At this time, with respect to chromatic aberration correction, it is preferable that a material with small dispersion is used for positive lenses and a material with large dispersion is used for negative lenses. Currently, lithium fluoride and barium fluoride are generally known as chromatic aberration correction materials for calcium fluoride. Therefore, when calcium fluoride and barium fluoride are used as materials, it is preferable that calcium fluoride is used for positive lenses and barium fluoride is used for negative lenses. When lithium fluoride and calcium fluoride are used for materials, it is also preferable that lithium fluoride is used for positive lenses and calcium fluoride is used for negative lenses. Furthermore, in addition to this, strontium fluoride, sodium fluoride, potassium fluoride, or the like can be used as a material with dispersion larger than calcium fluoride. Negative lenses can also be constituted by these fluorides, and positive lenses can also be constituted by calcium fluoride.

Furthermore, when the distance between a surface having a minimum clear aperture within the third lens group and a stop surface is Ls and the distance between the first surface and the second surface is Lt, it is preferable that the following condition equation (2) is satisfied:

$$0.18 < Ls/Lt < 0.48 \quad (2)$$

Condition equation (2) establishes the distance between the minimum part of a significant light beam and an aperture stop. If condition equation (2) is not satisfied, a state results in which correction of chromatic aberration is not good. Furthermore, preferable boundary values are maximum 0.4 and minimum 0.24.

Furthermore, in at least two negative lenses in the fourth lens group, if the clear aperture is H and a diagonal length of an image field is D, it is preferable that the following condition equation (3) is satisfied.

$$7 < H/D < 18 \quad (3)$$

The condition equation (3) establishes the size and refractive power of negative lenses arranged in the fourth lens group for chromatic aberration correction. When the maximum of condition equation (3) is exceeded, fabrication difficulty and cost rapidly increase. If the minimum is exceeded, chromatic aberration correction cannot be sufficiently performed. Furthermore, preferable boundary values are maximum 16 and minimum 9. Furthermore, when a composite refractive power of at least two negative lenses which satisfy condition equation (3) is P, it is preferable that the following condition equation (4) is satisfied:

$$0.003 < |P| < 0.02 \quad (4)$$

If the maximum of condition equation (4) is exceeded, fabrication difficulty and cost rapidly increase. When the minimum is exceeded, chromatic aberration correction cannot be sufficiently performed. More preferable boundary values are maximum 0.017 and minimum 0.006.

In addition, when the clear aperture of a surface having the maximum clear aperture is Mx4 and the clear aperture of a surface having the minimum clear aperture is Mx4 within the fourth lens group, it is preferable that the following condition equation (5) is satisfied:

$$0.77 < Mn4/Mx4 < 1 \quad (5)$$

Condition equation (5) establishes a structure of an optical system having only one significant minimum value between the first and second surfaces which is suitable for chromatic aberration correction. If condition equation (5) is not satisfied, chromatic aberration correction is not good. A more preferable boundary value is minimum 0.8. The maximum is 1 which is a limited value because the condition equation is minimum/maximum.

Furthermore, when F numbers of the respective lenses which form the third lens group are FNi, it is preferable that the following is satisfied:

$$0.8 < |FNi| \quad (6).$$

Here, with respect to an F number FNi of a lens, when a focal length of the lens is fi and the clear aperture (diameter) of the lens is CLi, the following is true:

$$FNi = fi/CLi.$$

The above-mentioned condition (6) both corrects chromatic aberration and forms a stable good image. Here, in order to correct chromatic aberration, by reducing (brightening) an F number of a positive lens formed of a first glass material and a negative lens formed of a second glass material, effects of chromatic aberration correction can be significantly made. However, when the F number is made smaller than the range of the above-mentioned condition (6), it is not preferable because aberration fluctuation becomes large when the lens is decentered, and it is difficult to obtain a stable good image. Furthermore, in order to obtain a further stable good image, it is preferable that a boundary value of the above-mentioned condition (6) is set at 0.9.

The following explains numerical value embodiments of a projection optical system PL according to this invention.

[First Embodiment]

FIG. 1 is an optical path diagram of a projection optical system PL of a first embodiment. In the projection optical system PL of this embodiment, 157.62 nm is taken as a reference wavelength. Chromatic aberration is corrected within the range of 0.4 pm FWHM (full width at half maximum) with respect to the reference wavelength. Among lenses L101–L125 within the projection optical system PL, the lenses L109, L111, L112, L115, L118, and L119 are formed of barium fluoride ($BaF_2$), and the other lenses are formed of calcium fluoride ($CaF_2$) Thus, all of the lens components within the projection optical system PL are formed of fluoride.

As shown in FIG. 1, the projection optical system PL of this embodiment is constituted by, in order from the reticle R side as a first surface, a first lens group G1 having a negative refractive power, a second lens group G2 having a positive refractive power, a third lens group G3 having a negative refractive power, a fourth lens group G4 having an aperture stop AS within an optical path, and a fifth lens group G5 having a positive refractive power. An clear aperture of a light beam in the projection optical system PL monotonically increases within the first lens group G1 in the direction from the reticle R side to the wafer W side, the wafer W side being a second surface. The clear aperture of the light beam is at a relative maximum within the second lens group G2 and goes from an increased size to a decreased size within the second lens group G2. The clear aperture is at a minimum within the third lens group G3, and goes from a decreased size to an increased size within the third lens group G3. The clear aperture is at a relative maximum within the fourth lens group G4, monotonically decreases within the fifth lens group, and has only one significant minimum between the reticle R and the wafer In the fourth lens group G4, three sets of combinations in which positive and negative lenses are adjacent to each other are included. That is, the positive lens L114, the negative lens L115, and the positive lens L116 are adjacent to each other, the positive lens L117 and the negative lens L118 are adjacent to each other, and the negative lens L119 and the positive lens L120 are adjacent to each other. Among these positive and negative lenses, the positive lenses L114, L116, L117, and L120 are formed of calcium fluoride, and the negative lenses L115, L118, and L119 are formed of barium fluoride.

Various values of the projection optical system PL related to the first embodiment are shown in Table 1. In Table 1, NA is the numerical aperture of the wafer W side, φ is the diameter of an image circle on the wafer W surface, β is the magnification of the entire projection optical system, d0 is the distance from the first surface (reticle surface) to the optical surface closest to the first surface side, and WD is the distance from the optical surface closest to the second surface (wafer surface) side, to the second surface. The lens numbers of Table 1 correspond to the lenses L101–L125 shown in FIG. 1. Table 1 shows lens numbers, radius of curvature of the front surface, radius of curvature of the rear surface, on-axis interval, and material of each lens, in order from the left. Here, the surface facing the reticle R side of each lens is the front surface, and the surface facing the wafer W side is the rear surface. Positive symbols in the radius of curvature of the front surface indicate convex surfaces, and negative symbols indicate concave surfaces. Positive symbols in the radius of curvature of the rear surface are concave surfaces, and negative symbols are convex surfaces. A(1)–A(7) mean aspherical surfaces, and APERTURE STOP means an aperture stop.

Aspherical data of each surface is shown in Table 2. With respect to an aspherical surface, when the height in a direction perpendicular to the optical axis is y, the distance (sag amount) along the optical axis from a tangent plane at the vertex of an aspherical surface to a position on the aspherical surface at height y is Z, the radius of curvature at the vertex is r, the conical coefficient is K, and the n-order aspherical coefficients are A–F, the following equation is shown. This is CURV=1/r in Table 2.

$$Z = (y^2/r)/\left[1 + \{1 - (1+K)\cdot y^2/r^2\}^{1/2}\right] + A*y^4 + B*y^6 + C*y^8 + D*y^{10} + E*y^{12} + F*y^{14}$$

Here, mm can be used as one example of the units for the radius of curvature and interval in various values of this embodiment. The index of refraction of calcium fluoride for a reference wavelength of 157.62 nm is 1.5593067, and the index of refraction of barium fluoride is 1.65669. In this embodiment, dispersion $dn/d\lambda$ which is the amount of change of the index of refraction per 1 pm of calcium fluoride is $-2.606 \times 10^{-3}$/nm, and the dispersion $dn/d\lambda$ which is the amount of change of the index of refraction per 1 pm of barium fluoride is $-4.376 \times 10^{-3}$/nm. Furthermore, if the value of dispersion $dn/d\lambda$ which is the amount of change of the index of refraction per 1 pm is positive, the index of refraction n increases as the wavelength $\lambda$ becomes longer. If the value of this dispersion $dn/d\lambda$ is negative, the index of refraction n decreases as the wavelength $\lambda$ becomes longer.

TABLE 1

NA = 0.82
Ø = 20.6
β = ¼
d 0 = 49.0027
WD = 9.0000

| Lens Number | Radius of Curvature Front Surface | Back Surface | Interval | Material |
|---|---|---|---|---|
| L101 | −651.4672 | A(1) | 13.0000 | CaF2 |
|  |  |  | 21.6151 |  |
| L102 | −110.0000 | −2500.0000 | 49.9993 | CaF2 |
|  |  |  | 1.0000 |  |
| L103 | A(2) | −201.4467 | 46.9803 | CaF2 |
|  |  |  | 1.0000 |  |
| L104 | −1922.8315 | −271.1975 | 30.6714 | CaF2 |
|  |  |  | 1.0000 |  |
| L105 | 508.9911 | −574.2044 | 36.4902 | CaF2 |
|  |  |  | 55.7956 |  |
| L106 | 895.2837 | −458.1257 | 32.4709 | CaF2 |
|  |  |  | 1.0000 |  |
| L107 | 266.6754 | 915.2035 | 46.8959 | CaF2 |
|  |  |  | 1.0000 |  |
| L108 | 175.9242 | A(3) | 49.9504 | CaF2 |
|  |  |  | 15.4504 |  |

TABLE 1-continued

NA = 0.82
Ø = 20.6
β = ¼
d 0 = 49.0027
WD = 9.0000

| Lens Number | Radius of Curvature Front Surface | Back Surface | Interval | Material |
|---|---|---|---|---|
| L109 | ∞ | 124.7711 | 13.0000 | BaF2 |
|  |  |  | 28.1255 |  |
| L110 | −117.9102 | A(4) | 50.0000 | CaF2 |
|  |  |  | 5.6946 |  |
| L111 | −146.7570 | 1067.4538 | 30.0000 | BaF2 |
|  |  |  | 39.0891 |  |
| L112 | −229.3460 | 1008.2204 | 50.0000 | BaF2 |
|  |  |  | 4.0037 |  |
| L113 | A(5) | −206.0879 | 47.4643 | CaF2 |
|  |  |  | 10.0572 |  |
| L114 | 1092.6370 | −218.2017 | 53.2867 | CaF2 |
|  |  |  | 1.0000 |  |
| L115 | −467.9204 | 346.0346 | 20.0000 | BaF2 |
|  |  |  | 1.0000 |  |
| L116 | 273.4143 | −1673.6551 | 44.1478 | CaF2 |
|  |  |  | 1.0000 |  |
| L117 | 309.1394 | −450.9566 | 51.7187 | CaF2 |
|  |  |  | 8.2655 |  |
| L118 | −314.0034 | 2022.0764 | 20.0000 | BaF2 |
|  |  |  | 13.2775 |  |
|  |  |  | APERTURE STOP |  |
|  |  |  | 23.3438 |  |
| L119 | −488.5262 | 335.5696 | 20.2571 | BaF2 |
|  |  |  | 1.0000 |  |
| L120 | 330.4692 | −821.3865 | 41.7072 | CaF2 |
|  |  |  | 1.0000 |  |
| L121 | 250.0000 | 1080.8488 | 41.9068 | CaF2 |
|  |  |  | 23.7787 |  |
| L122 | 192.5070 | 615.8599 | 40.0000 | CaF2 |
|  |  |  | 1.0000 |  |
| L123 | 169.4237 | A(6) | 49.8065 | CaF2 |
|  |  |  | 1.0000 |  |
| L124 | 108.6565 | A(7) | 43.9455 | CaF2 |
|  |  |  | 7.8016 |  |
| L125 | −2721.0405 | ∞ | 50.0000 | CaF2 |

TABLE 2

| Surface Number | Curv C | K D | A E | B F |
|---|---|---|---|---|
| A(1) | 0.00508333 | 0.000000 | −2.28380E-07 | 1.47277E-11 |
|  | −1.30058E-15 | 1.28064E-19 | −7.39170E-24 | 0.00000E+00 |
| A(2) | −0.00000542 | 0.000000 | −5.49861E-08 | 2.09715E-12 |
|  | −1.20561E-16 | 5.79847E-21 | −2.02391E-25 | 0.00000E+00 |
| A(3) | 0.00723799 | 0.000000 | −5.64051E-08 | −4.28140E-12 |
|  | −1.91521E-16 | −5.03997E-21 | −2.06507E-25 | 0.00000E+00 |
| A(4) | −0.005000000 | 0.000000 | −7.90936E-09 | 2.93220E-12 |
|  | −3.42737E-16 | −1.82036E-20 | −1.51282E-24 | 0.00000E+00 |
| A(5) | 0.00102878 | 0.000000 | −4.38752E-08 | 1.06890E-12 |
|  | −5.19567E-17 | 1.67942E-21 | −4.80066E-26 | 0.00000E+00 |
| A(6) | 0.00143218 | 0.000000 | 4.21052E-08 | −2.68961E-13 |
|  | 4.25981E-17 | −9.44829E-22 | 9.58713E-26 | 0.00000E+00 |
| A(7) | 0.00420441 | 0.000000 | −2.60476E-08 | −2.45839E-12 |
|  | −9.81701E-16 | 4.09695E-21 | 3.33675E-24 | 0.00000E+00 |

The following shows the condition equation corresponding values.

Mx2/Mn3=234/112=2.09

Ls/Lt=450/1300=0.346

H/D=226/20.6=10.97

|P|=0.0091

Mn4/Mx4=226/251=0.9
|FNi|=|−2190/170|=12.882 (Lens L108)
|FNi|=|−190/127|=1.496 (Lens L109)
|FNi|=|−657/121|=5.430 (Lens L110)
|FNi|=|−195/134|=1.455 (Lens L111)
|FNi|=|−280/192|=1.458 (Lens L112)
|FNi|=|308/208|=1.481 (Lens L113)

Figure 5:
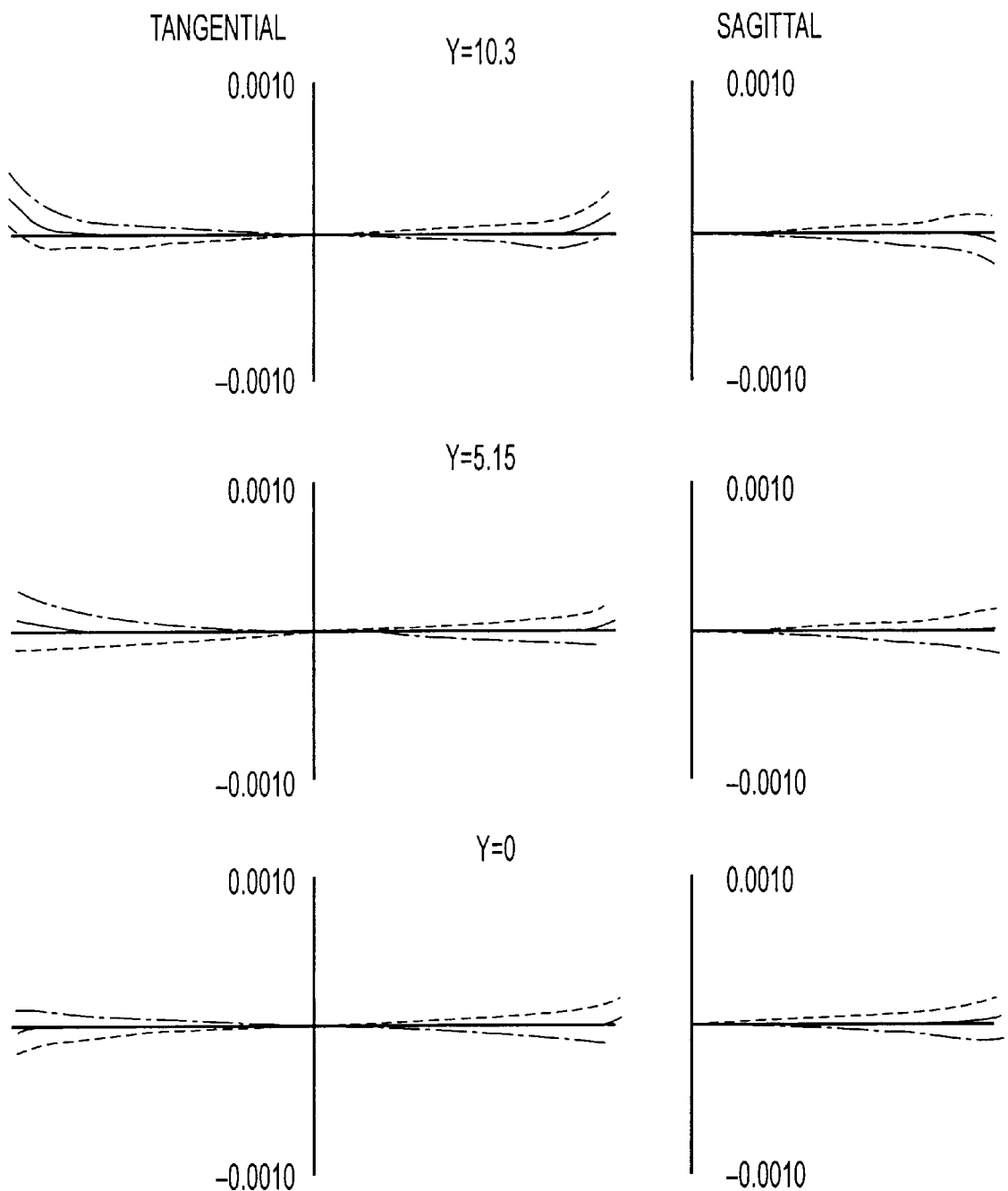
FIG. 5 shows aberration diagrams of a projection optical system of a first embodiment of this invention.

FIG. 5 shows horizontal aberration (coma aberration) in a tangential direction and in a sagittal direction of a projection optical system of the first embodiment. In the diagram, Y represents the image height, and aberration is shown at Y=0, Y=5.15, and the maximum image height of Y=10.3. In the diagram, solid lines show aberration at a wavelength of 157.62 nm, dashed lines show aberration at the reference wavelength +0.4 pm, and single-dot chain lines show aberration at the reference wavelength −0.4 pm, respectively. As is clear from the aberration diagrams, with respect to the projection optical system of this embodiment, aberration can be corrected well within the range of the image height 0 to the maximum image height, and good chromatic aberration can be accomplished within the wavelength range of FWHM 0.4 pm. Therefore, by incorporating the projection optical system of this embodiment into an exposure apparatus, even if a light source whose narrow band region is not developed is used, an extremely fine pattern can be transferred onto a wafer. The projection optical system of this embodiment has a round image field with a diameter of 20.6. Therefore, an elongate exposure region can be obtained with, for example, a width of approximately 5 in the scanning direction and a width of approximately 20 in a direction perpendicular to the direction within this image field. Furthermore, the units for image height and image field are mm when mm are used as the units for the radius of curvature and interval in Tables 1 and 2.

[Second Embodiment]

Figure 2:
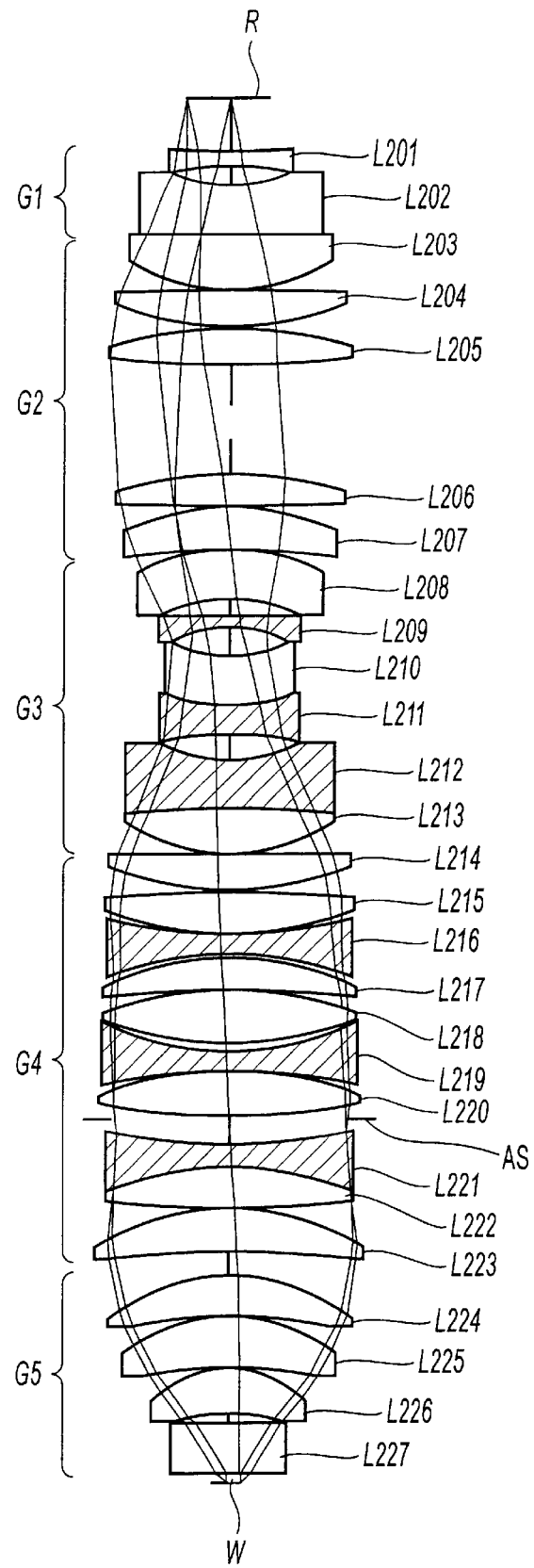
FIG. 2 is an optical path diagram of a projection optical system of a second embodiment of this invention.

FIG. 2 is an optical path diagram of a projection optical system PL of a second embodiment. In the projection optical system PL of this embodiment, 157.62 nm is taken as a reference wavelength. Chromatic aberration is corrected within the range of 0.6 pm FWHM (full width at half maximum) with respect to the reference wavelength. Among lenses L201–L227 within the projection optical system PL, the lenses L209, L211, L212, L216, L219, and L221 are formed of barium fluoride (BaF$_2$), and the other lenses are formed of calcium fluoride (CaF$_2$). Thus, all of the lens components within the projection optical system PL are formed of fluoride.

As shown in FIG. 2, the projection optical system PL of this embodiment is constituted by, in order from the reticle R side as a first surface, a first lens group G1 having a negative refractive power, a second lens group G2 having a positive refractive power, a third lens group G3 having a negative refractive power, a fourth lens group G4 having an aperture stop AS within an optical path, and a fifth lens group G5 having a positive refractive power. An clear aperture of a light beam in the projection optical system PL monotonically increases within the first lens group G1 in the direction from the reticle R side to the wafer W side, the wafer W side being a second surface. The clear aperture of the light beam is at a relative maximum within the second lens group G2 and goes from an increased size to a decreased size within the second lens group G2. The clear aperture is at a minimum within the third lens group G3, and goes from a decreased size to an increased size within the third lens group G3. The clear aperture is at a relative maximum within the fourth lens group G4, monotonically decreases within the fifth lens group, and has only one significant minimum between the reticle R and the wafer W.

In the fourth lens group G4, three sets of combinations in which positive and negative lenses are adjacent to each other are included. That is, the positive lens L215, the negative lens L216, and the positive lens L217 are adjacent to each other, the positive lens L218, the negative lens L219, and the positive lens L220 are adjacent to each other, and the negative lens L221 and the positive lens L222 are adjacent to each other. Among these positive and negative lenses, the positive lenses L215, L217, L218, L220, and L222 are formed of calcium fluoride, and the negative lenses L216, L219, and L221 are formed of barium fluoride.

Various values of the projection optical system PL related to the second embodiment are shown in Table 3. The lens numbers in Table 3 correspond to the lenses L201–L227 shown in FIG. 2. Aspherical surface data of each surface is shown in Table 4. The definitions of symbols and coefficients in Tables 3 and 4 are the same as in the above-mentioned first embodiment. Here, mm can be used as one example of the units for the radius of curvature and interval in various values of this embodiment.

TABLE 3

NA = 0.82
Ø = 20.6
β = ¼
d 0 = 50.8015
WD = 10.0487

| Lens Number | Radius of Curvature Front Surface | Back Surface | Interval | Material |
|---|---|---|---|---|
| L201 | −347.5929 | A(1) | 13.5370 | CaF2 |
|  |  |  | 20.7597 |  |
| L202 | −110.0000 | −2422.5818 | 50.0000 | CaF2 |
|  |  |  | 1.7471 |  |
| L203 | A(2) | −207.0381 | 50.0000 | CaF2 |
|  |  |  | 1.0688 |  |
| L204 | 2275.8968 | −321.1111 | 37.3056 | CaF2 |
|  |  |  | 1.7501 |  |
| L205 | 406.1096 | −1319.2733 | 36.3250 | CaF2 |
|  |  |  | 111.4377 |  |
| L206 | 363.1627 | −5758.5764 | 32.1320 | CaF2 |
|  |  |  | 2.7021 |  |
| L207 | 249.7397 | 607.9173 | 41.8375 | CaF2 |
|  |  |  | 1.1264 |  |
| L208 | 163.5659 | A(3) | 50.0000 | CaF2 |
|  |  |  | 16.1258 |  |
| L209 | ∞ | 125.8000 | 13.0000 | BaF2 |
|  |  |  | 28.5996 |  |
| L210 | −132.2630 | A(4) | 50.0000 | CaF2 |
|  |  |  | 1.0311 |  |
| L211 | −204.6707 | 360.1149 | 30.0000 | BaF2 |
|  |  |  | 26.8660 |  |
| L212 | −141.2335 | 1284.6424 | 50.0000 | BaF2 |
|  |  |  | 1.0000 |  |
| L213 | A(5) | −194.5080 | 43.1926 | CaF2 |
|  |  |  | 1.0000 |  |
| L214 | 2953.2036 | −289.0070 | 38.5362 | CaF2 |
|  |  |  | 1.0000 |  |
| L215 | 938.5634 | −327.2097 | 42.5674 | CaF2 |
|  |  |  | 1.0000 |  |
| L216 | −471.4329 | 288.9697 | 20.0000 | BaF2 |
|  |  |  | 4.2221 |  |
| L217 | 259.9177 | 845.9434 | 32.6625 | CaF2 |
|  |  |  | 1.0000 |  |
| L218 | 357.3411 | −361.0948 | 53.9026 | CaF2 |
|  |  |  | 8.2291 |  |
| L219 | −273.6992 | 518.0280 | 20.0000 | BaF2 |
|  |  |  | 1.0000 |  |
| L220 | 362.2033 | −584.1011 | 45.0799 | CaF2 |
|  |  |  | 5.0000 |  |
|  |  |  | APER-TURE STOP |  |
|  |  |  | 28.8776 |  |
| L221 | −372.1126 | 345.9930 | 20.2571 | BaF2 |
|  |  |  | 1.4781 |  |
| L222 | 355.4385 | −1275.1287 | 38.2789 | CaF2 |
|  |  |  | 1.0000 |  |

TABLE 3-continued

NA = 0.82
Ø = 20.6
β = ¼
d 0 = 50.8015
WD = 10.0487

| Lens Number | Radius of Curvature Front Surface | Back Surface | Interval | Material |
|---|---|---|---|---|
| L223 | 250.0000 | 1545.4839 | 41.8111 | CaF2 |
|  |  |  | 20.7769 |  |
| L224 | 189.9749 | 517.6110 | 40.0000 | CaF2 |
|  |  |  | 3.3286 |  |
| L225 | 174.8289 | A(6) | 50.0000 | CaF2 |
|  |  |  | 2.2748 |  |
| L226 | 109.1280 | A(7) | 45.4321 | CaF2 |
|  |  |  | 7.6757 |  |
| L227 | −2268.6099 | ∞ | 50.0000 | CaF2 |

TABLE 4

| Surface Number | Curv C | K D | A E | B F |
|---|---|---|---|---|
| A(1) | 0.00330905 | 0.000000 | −1.55401E-07 | 9.80748E-12 |
|  | −5.91884E-16 | 7.78132E-20 | −5.93033E-24 | 0.00000E+00 |
| A(2) | −0.00039103 | 0.000000 | −2.46491E-08 | 8.92562E-13 |
|  | −2.49615E-17 | 1.52447E-21 | −4.75574E-26 | 0.00000E+00 |
| A(3) | 0.00673385 | 0.000000 | −2.26886E-08 | −1.15109E-12 |
|  | −2.48542E-17 | −9.06227E-23 | 6.06210E-25 | 0.00000E+00 |
| A(4) | −0.00500000 | 0.000000 | 4.34229E-08 | −1.65895E-12 |
|  | −1.73872E-16 | −1.73641E-20 | 3.77326E-24 | 0.00000E+00 |
| A(5) | 0.00085689 | 0.000000 | −1.86450E-08 | 4.92544E-13 |
|  | −1.10213E-17 | 3.66735E-22 | 8.85589E-27 | 0.00000E+00 |
| A(6) | 0.00143677 | 0.000000 | 5.59146E-08 | −8.39865E-13 |
|  | 7.21048E-17 | −1.69616E-21 | 1.32821E-25 | 0.00000E+00 |
| A(7) | 0.00391918 | 0.000000 | −4.52005E-08 | 4.93162E-13 |
|  | −1.09591E-15 | 1.89066E-20 | 3.84582E-24 | 0.00000E+00 |

The following shows the condition equation corresponding values.

Mx2/Mn3=240/116=2.07

Ls/Lt=477/1399=0.341

H/D=233/20.6=11.31

|P|=0.0111

Mn4/Mx4=231/258=0.895

|FNi|=|15121/173|=87.405 (Lens L208)

|FNi|=|−192/132|=1.455 (Lens L209)

|FNi|=|−950/125|=7.6 (Lens L210)

|FNi|=|−195/135|=1.444 (Lens L211)

|FNi|=|−191/195|=0.979 (Lens L212)

|FNi|=|302/206|=1.466 (Lens L213)

Figure 6:
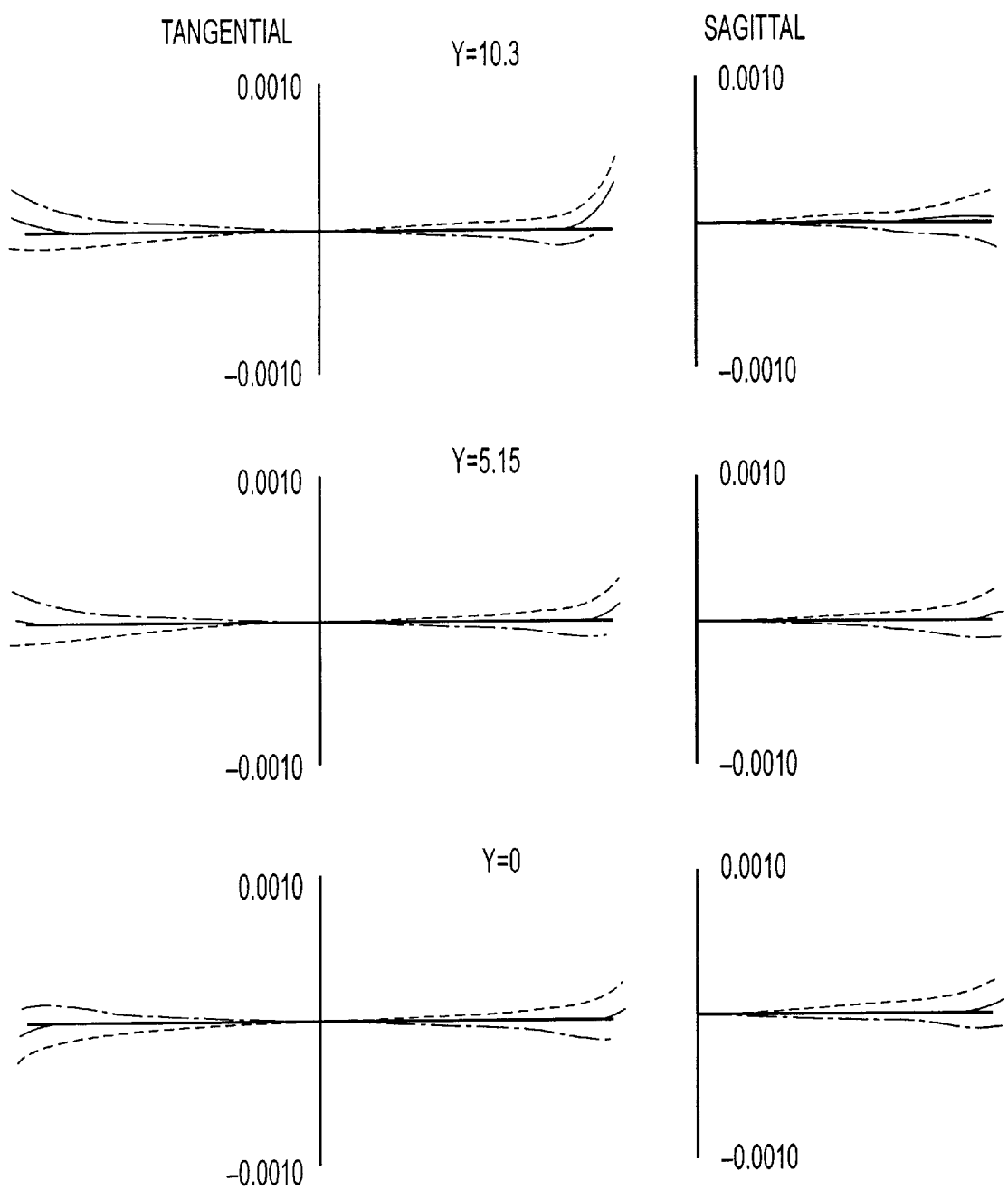
FIG. 6 shows aberration diagrams of a projection optical system of a second embodiment of this invention.

FIG. 6 shows horizontal aberration (coma aberration) in a tangential direction and in a sagittal direction of a projection optical system of the second embodiment. In the diagram, Y represents the image height, and aberration is shown at Y=0, Y=5.15, and the maximum image height of Y=10.3. In the diagram, solid lines show aberration at a wavelength of 157.62 nm, dashed lines show aberration at the reference wavelength +0.6 pm, and single-dot chain lines show aberration at the reference wavelength −0.6 pm, respectively. As is clear from the aberration diagrams, with respect to the projection optical system of this embodiment, aberration can be corrected well within the range of the image height 0 to the maximum image height, and good chromatic aberration can be accomplished within the wavelength range of FWHM 0.6 pm. Therefore, by incorporating the projection optical system of this embodiment into an exposure apparatus, even if a light source whose narrow band region is not developed is used, an extremely fine pattern can be transferred onto a wafer. The projection optical system of this embodiment has a round image field with a diameter of 22.6. Therefore, an elongate exposure region can be obtained with, for example, a width of approximately 5 in the scanning direction and a width of approximately 20 in a direction perpendicular to the direction within this image field. Furthermore, the units for the image field are mm when mm are used as the units for the radius of curvature and interval in Tables 3 and 4.

[Third Embodiment]

Figure 3:
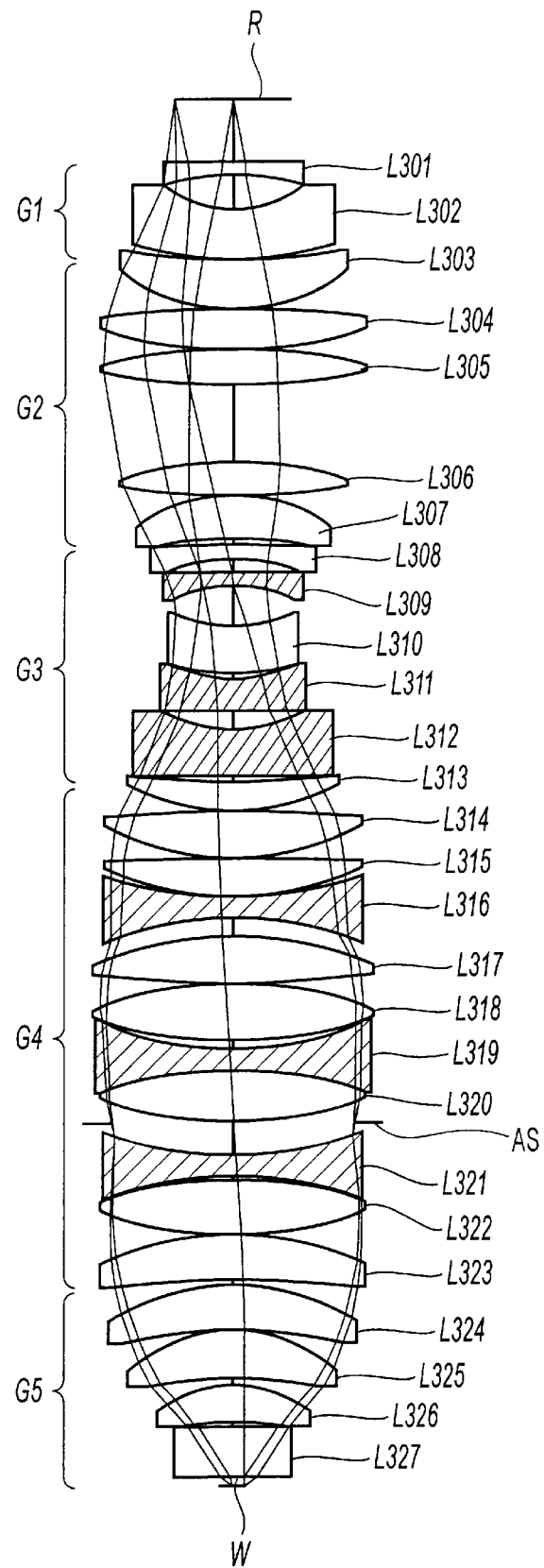
FIG. 3 is an optical path diagram of a projection optical system of a third embodiment of this invention.

FIG. 3 is an optical path diagram of a projection optical system PL of a third embodiment. In the projection optical system PL of this embodiment, 157.62 nm is taken as a reference wavelength. Chromatic aberration is corrected within the range of 0.6 pm FWHM (full width at half maximum) with respect to the reference wavelength. Among lenses L301–L327 within the projection optical system PL, the lenses L309, L311, L312, L316, L319, and L321 are formed of barium fluoride ($BaF_2$), and the other lenses are formed of calcium fluoride ($CaF_2$). Thus, all of the lens components within the projection optical system PL are formed of fluoride.

As shown in FIG. 3, the projection optical system PL of this embodiment is constituted by, in order from the reticle R side as a first surface, a first lens group G1 having a negative refractive power, a second lens group G2 having a positive refractive power, a third lens group G3 having a negative refractive power, a fourth lens group G4 having an aperture stop AS within an optical path, and a fifth lens group G5 having a positive refractive power. An clear aperture of a light beam in the projection optical system PL monotonically increases within the first lens group G1 in the direction from the reticle R side to the wafer W side, the wafer W side being a second surface. The clear aperture of the light beam is at a relative maximum within the second lens group G2 and goes from an increased size to a decreased size within the second lens group G2. The clear aperture is at a minimum within the third lens group G3, and goes from a decreased size to an increased size within the third lens group G3. The clear aperture is at a relative maximum within the fourth lens group G4, monotonically decreases within the fifth lens group, and has only one significant minimum between the reticle R and the wafer W.

In the fourth lens group G4, three sets of combinations in which positive and negative lenses are adjacent to each other are included. That is, the positive lens L315, the negative lens L316, and the positive lens L317 are adjacent to each other, the positive lens L318, the negative lens L319, and the positive lens 320 are adjacent to each other, and the negative lens L321 and the positive lens L322 are adjacent to each other. Among these positive and negative lenses, the positive lenses L315, L317, L318, L320, and L322 are formed of calcium fluoride, and the negative lenses L316, L319, and L321 are formed of barium fluoride.

Various values of the projection optical system PL according to the third embodiment are shown in Table 5. The lens numbers in Table 5 correspond to the lenses L301–L327 shown in FIG. 3. Aspherical surface data of each surface is shown in Table 6. The definitions of symbols and coefficients in Tables 5 and 6 are the same as in the above-mentioned first embodiment. Here, mm can be used as one example of the units for the radius of curvature and interval in various values of this embodiment.

TABLE 5

NA = 0.83
Ø = 22.6
β = ⅕
d 0 = 65.0449
WD = 9.0000

| Lens Number | Radius of Curvature Front Surface | Back Surface | Interval | Material |
|---|---|---|---|---|
| L301 | 1166.9632 | A(1) | 13.0000 | CaF2 |
|  |  |  | 37.4852 |  |
| L302 | −110.6154 | −379.5865 | 50.0000 | CaF2 |
|  |  |  | 1.0258 |  |
| L303 | A(2) | −192.7764 | 49.6611 | CaF2 |
|  |  |  | 1.0000 |  |
| L304 | 1085.7793 | −428.5313 | 39.9684 | CaF2 |
|  |  |  | 1.0000 |  |
| L305 | 541.8291 | −922.7317 | 36.0919 | CaF2 |
|  |  |  | 82.7788 |  |
| L306 | 378.2576 | −1015.4605 | 33.7172 | CaF2 |
|  |  |  | 1.0000 |  |
| L307 | 160.0000 | 370.3756 | 45.7237 | CaF2 |
|  |  |  | 7.0120 |  |
| L308 | 1131.6743 | A(3) | 14.3093 | CaF2 |
|  |  |  | 14.7161 |  |
| L309 | ∞ | 124.3671 | 13.0000 | BaF2 |
|  |  |  | 42.8662 |  |
| L310 | −142.5635 | A(4) | 50.0000 | CaF2 |
|  |  |  | 6.4821 |  |
| L311 | −130.2930 | 11238.6244 | 33.0000 | BaF2 |
|  |  |  | 19.2395 |  |
| L312 | −146.8338 | −5818.0478 | 50.0000 | BaF2 |
|  |  |  | 5.6922 |  |
| L313 | A(5) | −218.7197 | 32.0684 | CaF2 |
|  |  |  | 1.2053 |  |
| L314 | 1161.4214 | −263.2865 | 48.7242 | CaF2 |
|  |  |  | 1.0000 |  |
| L315 | 2425.7148 | −328.5519 | 38.8974 | CaF2 |
|  |  |  | 1.0000 |  |
| L316 | −408.1574 | 299.7816 | 21.9417 | BaF2 |
|  |  |  | 20.2539 |  |
| L317 | 321.5454 | −1094.8316 | 48.7910 | CaF2 |
|  |  |  | 1.0000 |  |
| L318 | 340.7458 | −461.4745 | 59.0261 | CaF2 |
|  |  |  | 9.0836 |  |
| L319 | −332.8659 | 359.7088 | 21.9417 | BaF2 |
|  |  |  | 1.0583 |  |
| L320 | 361.4592 | −458.2498 | 53.8180 | CaF2 |
|  |  |  | 5.0000 |  |
|  |  |  | APERTURE STOP |  |
|  |  |  | 31.8961 |  |
| L321 | −351.3206 | 340.5025 | 22.2238 | BaF2 |
|  |  |  | 3.9379 |  |
| L322 | 387.1695 | −384.8732 | 54.1700 | CaF2 |
|  |  |  | 1.0000 |  |
| L323 | 302.2703 | 1104.7960 | 47.0000 | CaF2 |
|  |  |  | 4.6463 |  |
| L324 | 212.0535 | 388.2518 | 45.0000 | CaF2 |
|  |  |  | 1.7041 |  |
| L325 | 146.4795 | A(6) | 50.0000 | CaF2 |
|  |  |  | 5.7202 |  |
| L326 | 135.5815 | A(7) | 38.2164 | CaF2 |
|  |  |  | 6.8613 |  |
| L327 | −2622.2061 | ∞ | 50.0000 | CaF2 |

TABLE 6

| Surface Number | Curv C | K D | A E | B F |
|---|---|---|---|---|
| A(1) | 0.00562967 | 0.000000 | −1.33458E-07 | 4.51141E-12 |
|  | −2.58854E-16 | 1.30846E-20 | −5.20101E-25 | 0.00000E+00 |
| A(2) | −0.00102608 | 0.000000 | −2.43590E-08 | 4.31037E-13 |
|  | −1.72011E-17 | 4.53150E-22 | −1.21226E-26 | 0.00000E+00 |
| A(3) | 0.00635565 | 0.000000 | −6.80307E-08 | −3.35778E-12 |
|  | −4.56540E-17 | 5.72800E-21 | 1.26855E-25 | 0.00000E+00 |
| A(4) | −0.00500000 | 0.000000 | −1.15317E-08 | −1.41463E-12 |
|  | −3.08424E-16 | −2.58539E-20 | 6.63253E-25 | 0.00000E+00 |
| A(5) | −0.00057595 | 0.000000 | −3.20249E-08 | 3.63964E-13 |
|  | −3.00735E-17 | 4.95364E-22 | −2.39840E-26 | 0.00000E+00 |
| A(6) | 0.00142092 | 0.000000 | 1.07948E-08 | −3.59840E-13 |
|  | −1.14407E-18 | 1.14964E-21 | −5.88501E-26 | 0.00000E+00 |
| A(7) | 0.00318547 | 0.000000 | −1.81289E-08 | 2.51586E-12 |
|  | −4.08920E-16 | −3.10463E-20 | 2.82402E-24 | 0.00000E+00 |

The following shows the condition equation corresponding values.

$Mx2/Mn3 = 261/116 = 2.25$ $Ls/Lt = 529/1450 = 0.365$ $H/D = 244/22.6 = 10.80$ $|P| = 0.0115$ $Mn4/Mx4 = 236/270 = 0.874$ $|FNi| = |-328/159| = 2.063$ (Lens L308)

$|FNi| = |-189/135| = 1.4$ (Lens L309)

$|FNi| = |-1291/124| = 10.411$ (Lens L310)

$|FNi| = |-196/140| = 1.4$ (Lens L311)

$|FNi| = |-230/193| = 1.192$ (Lens L312)

$|FNi| = |444/206| = 2.155$ (Lens L313)

Figure 7:
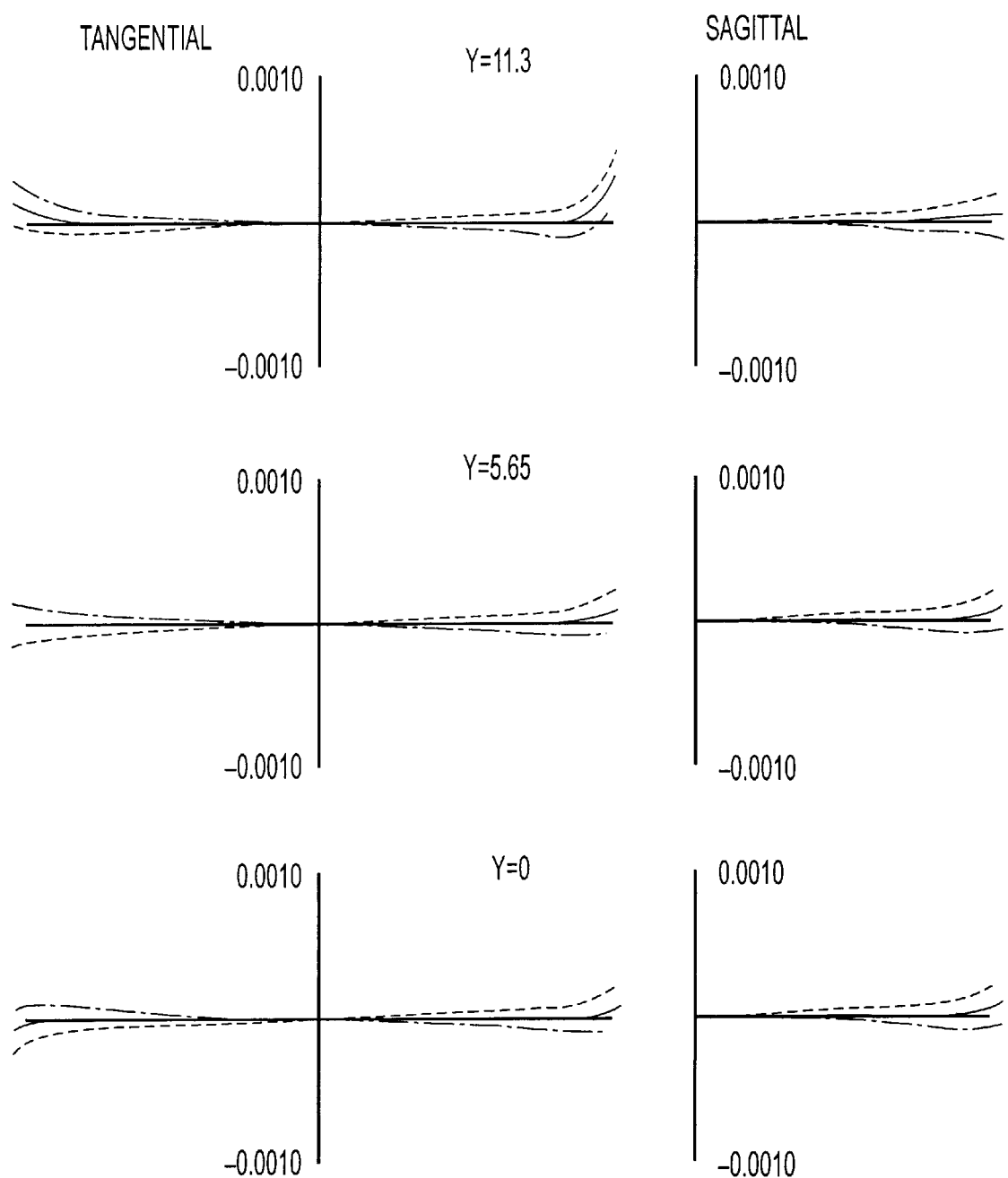
FIG. 7 shows aberration diagrams of a projection optical system of a third embodiment of this invention.

FIG. 7 shows horizontal aberration (coma aberration) in a tangential direction and in a sagittal direction of a projection optical system of the third embodiment. In the diagram, Y represents the image height, and aberration is shown at Y=0, Y=5.65, and the maximum image height of Y=11.3. In the diagram, solid lines show aberration at a wavelength of 157.62 nm, dashed lines show aberration at the reference wavelength +0.6 pm, and single-dot chain lines show aberration at the reference wavelength −0.6 pm, respectively. As is clear from the aberration diagrams, with respect to the projection optical system of this embodiment, aberration can be corrected well within the range of the image height 0 to the maximum image height, and good chromatic aberration can be accomplished within the wavelength range of FWHM 0.6 pm. Therefore, by incorporating the projection optical system of this embodiment into an exposure apparatus, even if a light source whose narrow band region is not developed is used, an extremely fine pattern can be transferred onto a wafer. The projection optical system of this embodiment has a round image field with a diameter of 22.6. Therefore, an elongate exposure region can be obtained with, for example, a width of approximately 5 in the scanning direction and a width of approximately 22 in a direction perpendicular to the direction within this image field. Furthermore, the units for the image field are mm when mm are used as the units for the radius of curvature and interval in Tables 5 and 6.

[Fourth Embodiment]

Figure 4:
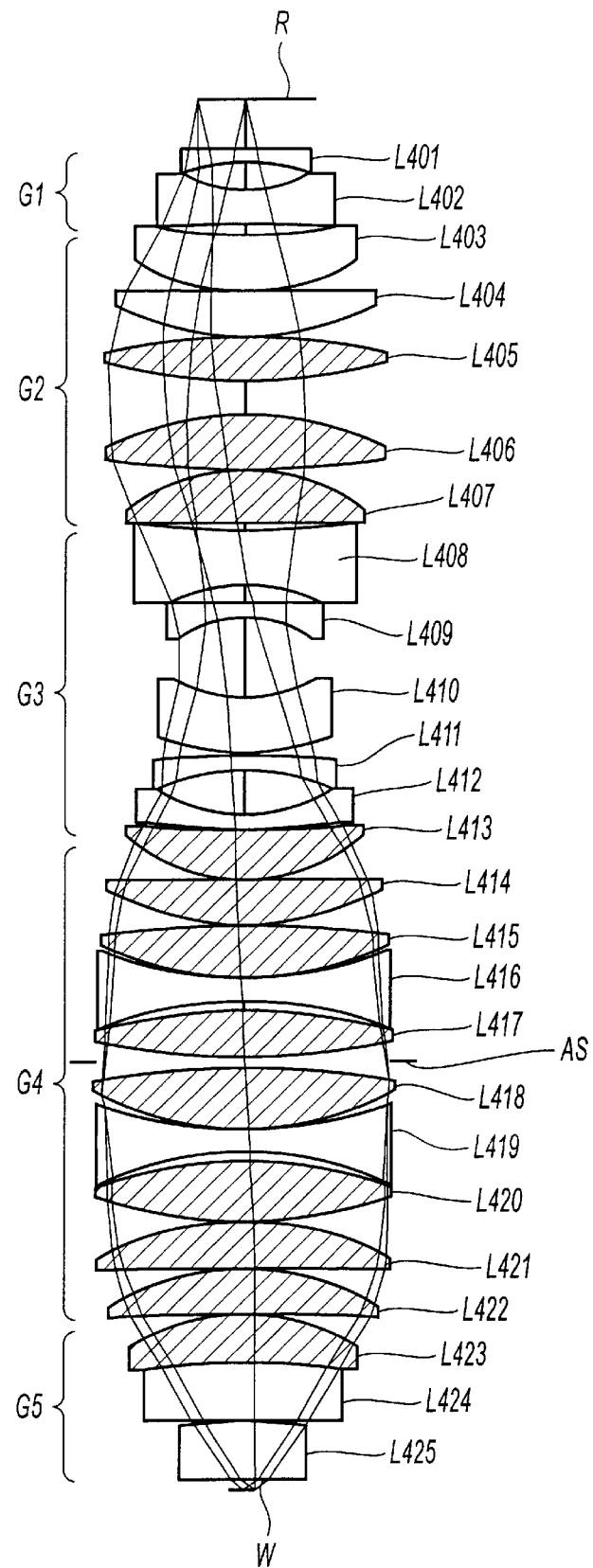
FIG. 4 is an optical path diagram of a projection optical system of a fourth embodiment of this invention.

FIG. 4 is an optical path diagram of a projection optical system PL of a fourth embodiment. In the projection optical system PL of this embodiment, 157.62 nm is taken as a reference wavelength. Chromatic aberration is corrected within the range of 0.5 pm FWHM (full width at half maximum) with respect to the reference wavelength. Among lenses L401–L425 within the projection optical system PL, the lenses L405, L406, L407, L413, L414, L415, L417, L418, L420, L421, L422, and L423 are formed of lithium fluoride (LiF) and the other lenses are formed of calcium fluoride (CaF$_2$). Thus, all of the lens components within the projection optical system PL are formed of fluoride.

As shown in FIG. 4, the projection optical system PL of this embodiment is constituted by, in order from the reticle R side as a first surface, a first lens group G1 having a negative refractive power, a second lens group G2 having a positive refractive power, a third lens group G3 having a negative refractive power, a fourth lens group G4 having an aperture stop AS within an optical path, and a fifth lens group G5 having a positive refractive power. An effective diameter of a light beam in the projection optical system PL monotonically increases within the first lens group G1 in the direction from the reticle R side to the wafer W side, the wafer W side being a second surface. The effective diameter of the light beam is at a relative maximum within the second lens group G2 and goes from an increased size to a decreased size within the second lens group G2. The effective diameter is at a minimum within the third lens group G3, and goes from a decreased size to an increased size within the third lens group G3. The effective diameter is at a relative maximum within the fourth lens group G4, monotonically decreases within the fifth lens group, and has only one significant minimum between the reticle R and the wafer W.

In the fourth lens group G4, two sets of combinations in which positive and negative lenses are adjacent to each other are included. That is, the positive lens L415, the negative lens L416, and the positive lens L417 are adjacent to each other, and the positive lens L418, the negative lens L419, and the positive lens 420 are adjacent to each other. Among these positive and negative lenses, the positive lenses L415, L417, L418 and L420 are formed of lithium fluoride, and the negative lenses L416 and L419 are formed of calcium fluoride.

Various values of the projection optical system PL according to the fourth embodiment are shown in Table 7. The lens numbers in Table 7 correspond to the lenses L401–L425 shown in FIG. 4. Aspherical data of the respective surfaces is shown in Table 8. The definitions of symbols and coefficients in Tables 7 and 8 are the same as in the above-mentioned first embodiment. Here, mm can be used as one example of the units for radius of curvature and interval in various values of this embodiment. The index of refraction of lithium fluoride for a reference wavelength of 157.62 nm is 1.4859. In this embodiment, dispersion dn/dλ which is the amount of change of the index of refraction per 1 pm of calcium fluoride is -2.606×10$^{-3}$/nm, and dispersion dn/dλ which is the amount of change of the index of refraction per 1 pm of lithium fluoride is -1.711×10$^{-3}$/nm. Furthermore, if the value of dispersion dn/dλ which is the amount of change of the index of refraction per 1 pm is positive, the index of refraction n increases as the wavelength λ becomes longer. If the value of dispersion dn/dλ is negative, the index of refraction n decreases as the wavelength λ becomes longer.

TABLE 7

NA = 0.82
Ø = 20.6
β = ¼
d 0 = 47.0085
WD = 9.3388

| Lens Number | Radius of Curvature Front Surface | Back Surface | Interval | Material |
|---|---|---|---|---|
| L401 | ∞ | A(1) | 13.0000 | CaF2 |
|  |  |  | 22.2233 |  |
| L402 | -110.0000 | 1309.7024 | 31.5240 | CaF2 |
|  |  |  | 8.6729 |  |
| L403 | A(2) | -192.9993 | 49.9983 | CaF2 |
|  |  |  | 1.0000 |  |
| L404 | -24591.6249 | -250.4844 | 39.9873 | CaF2 |
|  |  |  | 1.0136 |  |
| L405 | 524.9113 | -476.9535 | 40.0000 | LiF |
|  |  |  | 29.1413 |  |
| L406 | 250.1273 | -995.9358 | 49.6664 | LiF |
|  |  |  | 1.0197 |  |
| L407 | 160.0000 | ∞ | 50.0000 | LiF |
|  |  |  | 5.7813 |  |
| L408 | A(3) | 141.3803 | 50.0000 | CaF2 |
|  |  |  | 15.2837 |  |
| L409 | 1443.6200 | 93.7861 | 13.9389 | CaF2 |
|  |  |  | 73.1876 |  |
| L410 | -115.9482 | -200.0113 | 49.9517 | CaF2 |
|  |  |  | 3.2043 |  |
| L411 | A(4) | 173.1392 | 13.4188 | CaF2 |
|  |  |  | 40.8651 |  |
| L412 | -139.0144 | A(5) | 13.0000 | CaF2 |
|  |  |  | 1.0018 |  |
| L413 | -1657.9961 | -151.9461 | 44.9760 | LiF |
|  |  |  | 1.0000 |  |
| L414 | 18418.2668 | -250.0000 | 40.1874 | LiF |
|  |  |  | 1.0000 |  |
| L415 | 731.9416 | -286.5709 | 48.4169 | LiF |
|  |  |  | 1.0000 |  |
| L416 | -311.8261 | 299.5589 | 20.0000 | CaF2 |
|  |  |  | 8.9374 |  |
| L417 | 419.5013 | -617.4548 | 42.4661 | LiF |
|  |  |  | 5.0000 |  |
|  |  |  | APERTURE STOP |  |
|  |  |  | 5.0392 |  |
| L418 | 672.4545 | -265.9995 | 55.4673 | LiF |
|  |  |  | 1.0000 |  |
| L419 | -361.4378 | 264.6026 | 20.2571 | CaF2 |
|  |  |  | 8.5924 |  |
| L420 | 342.6820 | -426.2790 | 53.6958 | LiF |
|  |  |  | 1.0766 |  |
| L421 | 252.2904 | 3572.9998 | 42.0000 | LiF |
|  |  |  | 1.0000 |  |
| L422 | 215.7677 | 1650.3645 | 39.9999 | LiF |
|  |  |  | 1.0000 |  |
| L423 | 183.6896 | A(6) | 42.7255 | LiF |
|  |  |  | 1.3070 |  |
| L424 | 576.4084 | A(7) | 49.8502 | CaF2 |
|  |  |  | 1.0074 |  |
| L425 | 382.0188 | 794.0176 | 49.9633 | CaF2 |

TABLE 8

| Surface Number | Curv C | K D | A E | B F |
|---|---|---|---|---|
| A(1) | 0.00609851 | 0.000000 | -2.72431E-07 | 1.26326E-11 |
|  | -9.13755E-16 | 5.92353E-20 | -2.71986E-24 | 0.00000E+00 |
| A(2) | -0.00187494 | 0.000000 | -9.61981E-09 | 1.64503E-13 |
|  | 1.00819E-17 | -5.48244E-22 | 1.84903E-25 | 0.00000E+00 |
| A(3) | -0.00120636 | 0.000000 | 9.81895E-09 | -6.68314E-13 |
|  | 3.85998E-17 | -1.52515E-21 | 3.79010E-26 | -2.16775E-31 |

TABLE 8-continued

| Surface Number | Curv C | K D | A E | B F |
|---|---|---|---|---|
| A(4) | 0.00064929 | 0.000000 | 4.80843E-08 | 2.39534E-12 |
|  | 7.48626E-17 | 6.52727E-21 | −5.01082E-25 | 0.00000E+00 |
| A(5) | −0.00200794 | 0.000000 | 6.33703E-08 | −1.35830E-13 |
|  | −6.4903E-17 | 2.85755E-21 | 1.02489E-25 | 0.00000E+00 |
| A(6) | 0.00171484 | 0.000000 | 1.97953E-09 | 2.11738E-12 |
|  | −1.85924E-16 | 7.15242E-21 | −3.58848E-25 | 0.00000E+00 |
| A(7) | 0.00024581 | 0.000000 | −5.72773E-08 | 9.14803E-12 |
|  | −3.52325E-16 | −3.14111E-20 | 5.97152E-24 | 0.00000E+00 |

The following shows the condition equation corresponding values.

Mx2/Mn3=240/114=2.11
Ls/Lt=408/1280=0.319
H/D=242/20.6=11.75
|P|=0.0074
Mn4/Mx4=227/254=0.894
|FNi|=|−212/186|=1.140 (Lens L408)
|FNi|=|−180/129|=1.395 (Lens L409)
|FNi|=|−627/143|=4.385 (Lens L410)
|FNi|=|−350/151|=2.318 (Lens L411)
|FNi|=|−349/181|=1.928 (Lens L412)
|FNi|=|341/198|=1.722 (Lens L413)

Figure 8:
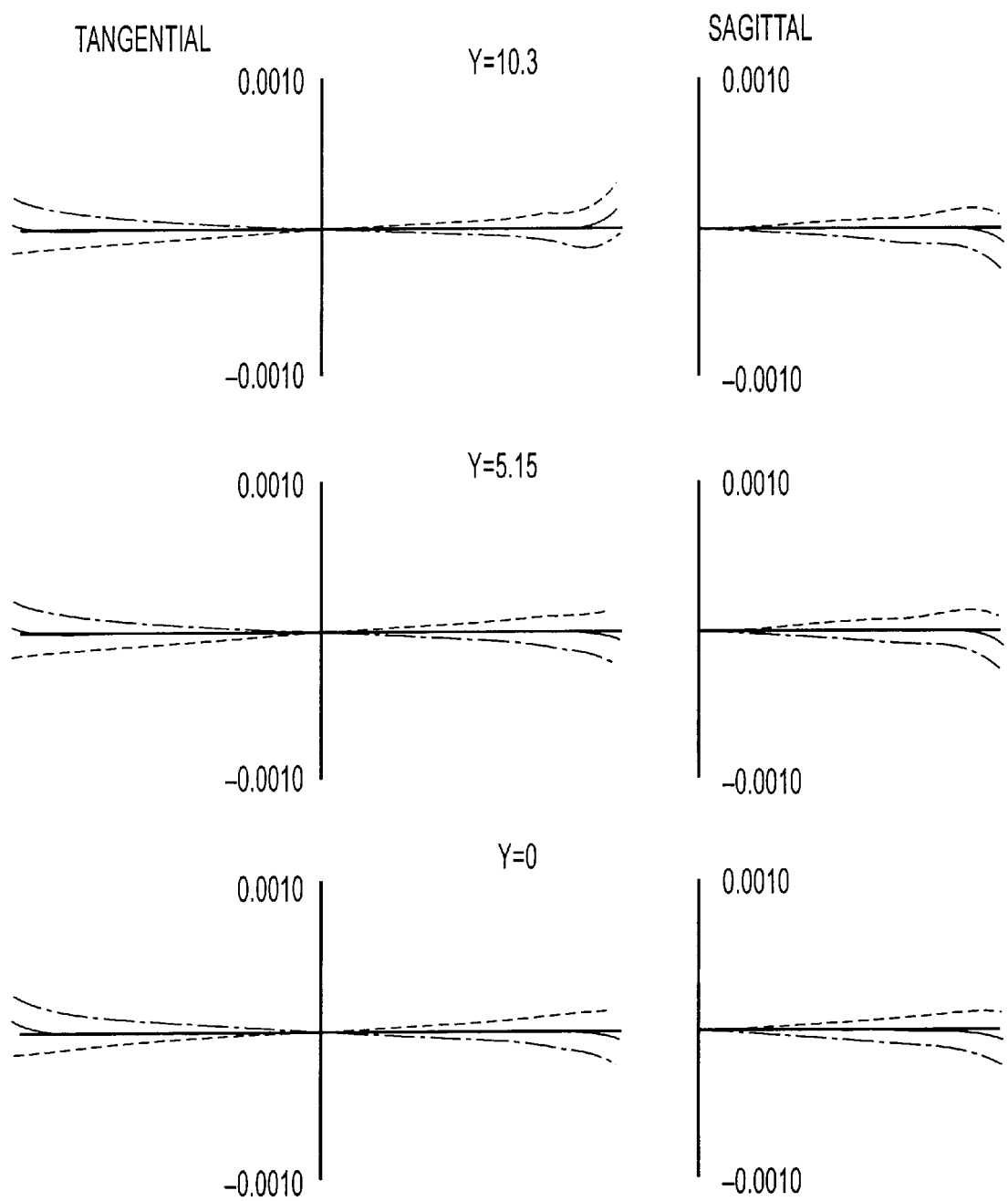
FIG. 8 shows aberration diagrams of a projection optical system of a fourth embodiment of this invention.

FIG. 8 shows horizontal aberration (coma aberration) in a tangential direction and in a sagittal direction of a projection optical system of the fourth embodiment. In the diagram, Y represents the image height, and aberration is shown at Y=0, Y=5.15, and the maximum image height of Y=10.3. In the diagram, solid lines show aberration at a wavelength of 157.62 nm, dashed lines show aberration at the reference wavelength +0.5 pm, and single-dot chain lines show aberration at the reference wavelength −0.5 pm, respectively. As is clear from the aberration diagrams, with respect to the projection optical system of this embodiment, aberration can be corrected well within the range of the image height 0 to the maximum image height, and good chromatic aberration can be accomplished within the wavelength range of FWHM 0.5 pm. Therefore, by incorporating the projection optical system of this embodiment into an exposure apparatus, even if a light source whose narrow band region is not developed is used, an extremely fine pattern can be transferred onto a wafer. The projection optical system of this embodiment has a round image field with a diameter of 20.6. Therefore, an elongate exposure region can be obtained with, for example, a width of approximately 5 in the scanning direction and a width of approximately 20 in a direction perpendicular to the direction within this image field. Furthermore, the units for the image field are mm when mm are used as the units for the radius of curvature and interval in Tables 7 and 8.

Figure 9:
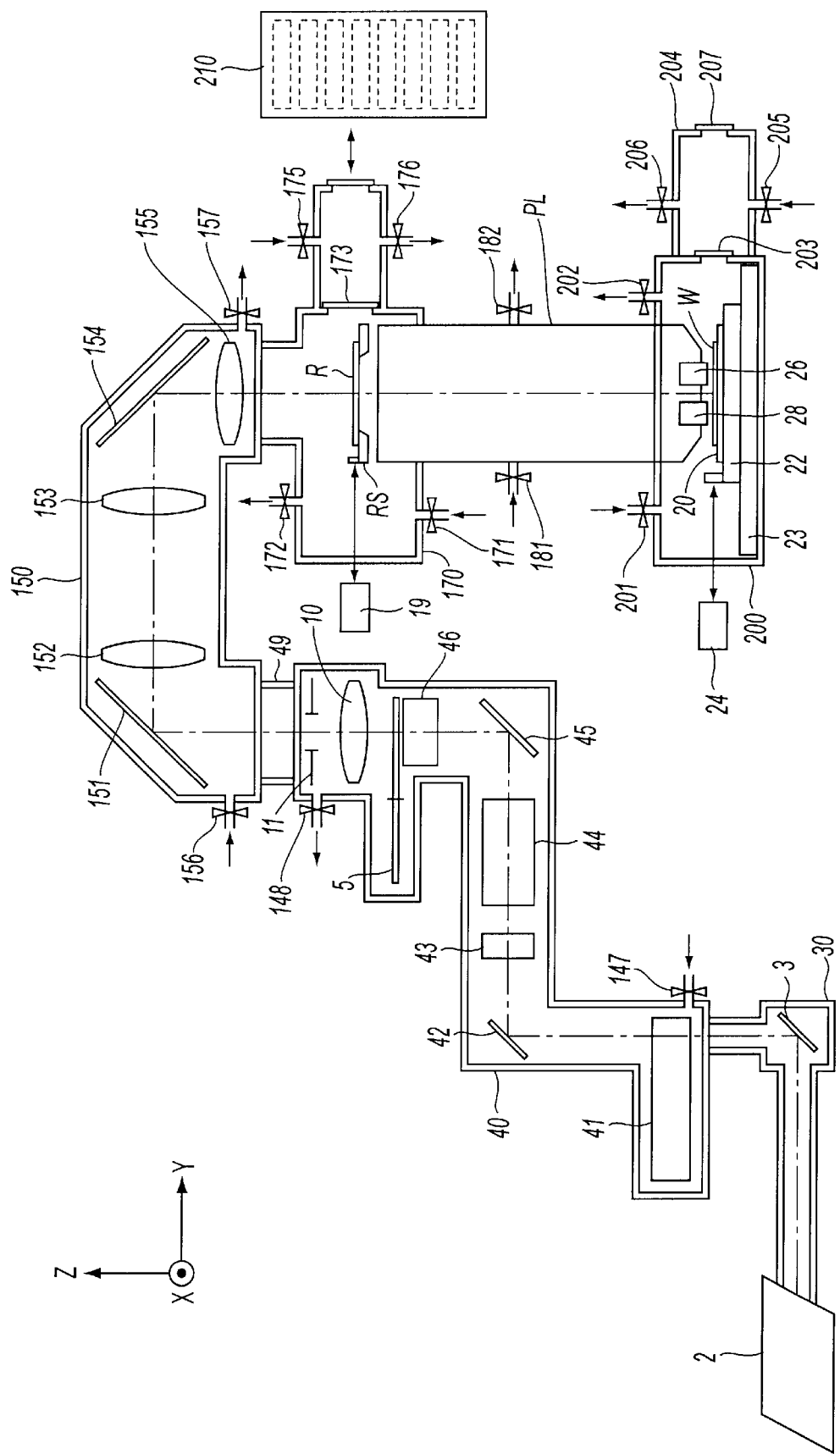
FIG. 9 is a structural diagram of a projection exposure apparatus related to embodiments of this invention.

The projection optical system of the above-mentioned first through fourth embodiments can be applied to a projection exposure apparatus of embodiments shown in FIG. 9. The following explains embodiments of the exposure apparatus according to this invention with reference to FIG. 9. FIG. 9 is a diagram showing a schematic structure of a projection exposure apparatus according to embodiments of this invention. In FIG. 9, an XYZ coordinate system is used. A Z axis is set along a normal line direction of a wafer W, a Y axis is set in a direction parallel to the paper plane of FIG. 9 within the wafer W plane, and an X axis is set in a direction perpendicular to the paper plane of FIG. 9 within the wafer W plane.

In the exposure of these embodiments, by using an $F_2$ laser light source as an exposure light source and a dioptric projection optical system of any of the above-mentioned first through fourth embodiments as a projection optical system PL, this invention is applied to the exposure apparatus. In the projection exposure apparatus of this embodiment, a step-and-scan method is used which, by synchronously relatively scanning a reticle and a substrate in a predetermined direction with respect to a predetermined shaped illumination region on the reticle, consecutively transfers a pattern image of the reticle to one shot region on the substrate. In this type of step-and-scan exposure apparatus, a pattern of the reticle can be exposed to a region on a substrate wider than an exposure field of the projection optical system.

In FIG. 9, a laser light source 2 has, for example, a fluoride dimer laser ($F_2$ laser) with an oscillation wavelength of 157 nm. $F_2$ laser has a half value full width of approximately 0.6 pm at a natural oscillation. Furthermore, a band narrowing device can also be incorporated into this $F_2$ laser. Furthermore, as a laser light source 2 in this embodiment, a light source which emits light in a vacuum ultraviolet region at a wavelength of approximately 120 nm–180 nm, for example, a krypton dimer laser ($Kr_2$ laser) at an oscillation wavelength of 146 nm, an argon dimer laser ($Ar_2$ laser) at an oscillation wavelength of 126 nm, or the like can be used.

Pulse laser light (illumination light) from the laser light source 2 is deflected by a deflecting mirror 3, goes to an optical path delay optical system 41, and is temporarily divided into a plurality of light beams with an optical path length difference of the temporal coherence length or more of the illumination light from the laser light source 2. Furthermore, this type of optical path delay optical system is disclosed in, for example, Japanese Laid-Open Patent Applications 1-198759 and 11-174365.

After illumination light emitted from the optical path delay optical system 41 is deflected by an optical path deflecting mirror 42, it reaches a second fly's eye lens 46 via a first fly's eye lens 43, a zoom lens 44, and an oscillation mirror 45 in order. On the emitting side of the second fly's eye lens 46, a switching revolver 5 for an illumination optical system aperture stop is arranged to set a desired size and shape of an effective light source. In this example, in order to reduce a light amount loss in the illumination optical system aperture stop, the size of the light beam to the second fly's eye lens 46 through the zoom lens 44 is variable.

The light beam emitted from an aperture of the illumination optical system aperture stop illuminates an illumination field stop (reticle blind) 11 via a condenser lens group 10. Furthermore, the illumination field stop 11 is disclosed in Japanese Laid-Open Patent Application 4-196513 and the corresponding U.S. Pat. No. 5,473,410.

The light from the illumination field stop 11 is guided onto the reticle R via an illumination field stop imaging optical system (reticle blind imaging system) formed of deflecting mirrors 151 and 154 and lens groups 152, 153 and 155, and an illumination region which is an image of an aperture part of the illumination field stop 11 is formed on the reticle R. The light from the illumination region on the reticle R is guided onto the wafer W via the projection optical system PL, and a reduced image of a pattern within the illumination region of the reticle R is formed on the wafer W. A reticle stage RS which holds the reticle R is two-dimensionally movable within an XY plane, and the position coordinate is measured by an interferometer 19 and position-controlled. Furthermore, a wafer stage 22 which holds the wafer W is also two-dimensionally movable within the XY plane, and the position coordinate is measured by an interferometer 24 and position-controlled. Within this arrangement, the reticle and the substrate can be synchronously scanned with high accuracy.

If light of a wavelength of a vacuum ultraviolet region is used as the exposure light, a gas (hereafter referred to as "absorptive gas"), such as oxygen, moisture, hydro-carbon system gas, or the like, having a strong absorption characteristic with respect to the light of the related wavelength band region needs to be eliminated. Therefore, in this embodiment, an illumination optical path (optical path from the laser light source 2 to the reticle R) and the projection optical path (optical path from the reticle R to the wafer W) are shielded from outside atmosphere, and the optical paths are filled with a mixed gas (hereafter referred to as "low absorptive gas" or "specified gas"), such as nitrogen, helium, argon, neon, krypton, or the like, as a specified gas having a characteristic with less absorption with respect to the light of the vacuum ultraviolet region.

Specifically, the optical path from the laser light source 2 to the light delay optical system 41 is shielded by a casing 30 from outside atmosphere. The optical path from the light delay optical system 41 to the illumination field stop 11 is shielded by a casing 40 from outside atmosphere, the illumination field stop imaging optical system is shielded by a casing 150 from outside atmosphere, and the above-mentioned specified gas is filled within the optical paths. The casings 40 and 150 are connected to a casing 49. Furthermore, a lens barrel of the projection optical system PL itself is a casing, and the above-mentioned specified gas is filled in the internal optical path. Furthermore, it is preferable that helium is used as a specified gas which is filled in the respective optical paths. However, nitrogen can also be used as the specified gas in the optical paths (casings 30, 40, 150) of the illumination optical system from the laser light source 2 to the reticle R.

The casing 170 shields a space between the projection optical system PL and the casing 150 which stores the illumination field stop imaging optical system from outside atmosphere and stores the reticle stage RS which hold the reticle R inside. In this casing 170, a door 173 is set for loading and ejecting the reticle R. Outside the door 173, a gas chamber 174 is provided which prevents atmosphere within the casing 170 from being polluted when the reticle R is loaded and ejected. A door 177 is arranged in this gas chamber 174 as well. Reticle transfer in the reticle stocker 210 which stores plural types of reticles is performed via the door 177.

The casing 200 shields the space between the projection optical system PL and the wafer W from outside atmosphere. Inside the casing 200, a wafer stage 22 which holds the wafer W, an oblique incidence auto focus sensor 26 which detects an inclination angle and a position (focus position) of a Z direction of a surface of the wafer W as a substrate, and an off-axis alignment sensor 28, and a holding plate 23 which mounts the wafer stage 22 are stored. In this casing 200, a door 203 is provided for loading and ejecting the wafer W. Outside this door 203, a gas chamber 204 is provided which prevents atmosphere inside the casing 200 from being polluted. In the gas chamber 204, a door 207 is provided. Loading and ejecting of the wafer W into/out of the apparatus can be performed via this door 207.

Here, gas supply valves 147, 156, 171 and 201 are arranged in the casings 40, 150, and 170 and 200, respectively. These gas supply valves 147, 156, 171 and 201 are connected to undepicted gas supply tube paths connected to a gas supply apparatus. Additionally, the casings 40, 150, 170 and 200 are provided with exhaust valves 148, 157, 172 and 202, respectively. These exhaust valves 148, 157, 172, and 202 are connected to the above-mentioned gas supply apparatus via undepicted exhaust tube paths, respectively. Furthermore, a specified gas from the gas supply apparatus is controlled by an undepicted temperature adjusting apparatus at a predetermined target temperature. Here, when helium is used as a specified gas, it is preferable that temperature adjusting apparatus are arranged in the vicinity of the respective casings.

In the same manner, gas supply valves 175 and 205 and exhaust valves 176 and 206 are also arranged in the gas chambers 174 and 204, respectively. Gas supply valves 175 and 205 are connected to the above-mentioned gas supply apparatus via gas supply tube paths, and the exhaust valves 176 and 206 are connected to the above-mentioned gas supply apparatus via the exhaust tube paths. Furthermore, an gas supply valve 181 and an exhaust valve 182 are also arranged in the lens barrel of the projection optical system PL, and the gas supply valve 181 is connected to the above-mentioned gas supply apparatus via an undepicted gas supply tube path, and the exhaust valve 182 is connected to the above-mentioned gas supply apparatus via an undepicted exhaust tube path.

Furthermore, in the gas supply tube paths in which the gas supply valves 147, 156, 171, 175, 181, 201, and 205 are arranged and exhaust tube paths in which the exhaust valves 148, 157, 172, 176, 182, 202, and 206 are arranged, a filter which removes a particle of an HEPA filter or a ULPA filter and a chemical filter which removes an absorptive gas such as oxygen or the like are arranged.

Additionally, in the gas chambers 174 and 204, gas exchange is needed every time the reticle or wafer is replaced. For example, in the case of reticle exchange, the door 174 is opened, the reticle is loaded from the reticle stocker 210 to the gas chamber 174, the door 174 is closed, and the gas chamber 174 is filled with a specified gas. After that, the door 173 is opened, and the reticle is mounted on the reticle stage RS. Furthermore, in the case of wafer exchange, the door 207 is opened, the wafer is loaded in the gas chamber 204, the door 207 is closed, and the gas chamber 204 is filled with a specified gas. After that, the door 203 is opened, and the wafer is mounted on the wafer holder 20. Additionally, when the reticle and the wafer are transferred out, the procedure is reversed. Furthermore, in the case of gas exchange to the gas chambers 174 and 204, after atmosphere within the gas chambers is evacuated, a specified gas also can be supplied from gas supply valves.

In addition, in the casings 170 and 200, there is a possibility that a gas in which gas was exchanged by the gas chambers 174 and 204 is mixed, and there is a high possibility that a large amount of absorptive gas such as oxygen or the like is mixed in the gas of the gas chambers 174 and 204. It is desirable that gas exchange is performed at the same timing as the gas exchange of the gas chambers 174 and 204. Furthermore, it is preferable that a specified gas with a pressure higher than outside atmosphere is filled in the casings and the gas chambers.

Furthermore, in FIG. 9, although not depicted, but in this embodiment, at least one lens element among a plurality of lens elements which form the projection optical system PL is held so that at least one of its position and posture can be changed. By so doing, an imaging characteristic of the projection optical system PL can be changed. This type of adjusting means is disclosed in, for example, Japanese Laid-Open Patent Application 4-192317, Japanese Laid-Open Patent Application 4-127514 (and the corresponding U.S. Pat. No. 5,117,255), Japanese Laid-Open Patent Application 5-41344, and Japanese Laid-Open Patent Application 6-84527 (and the corresponding U.S. Pat. No. 5,424,552). In this embodiment, it is preferable that at least one of the lens elements in which at least one of the position and the posture can be changed is a spherical lens.

Figure 10:
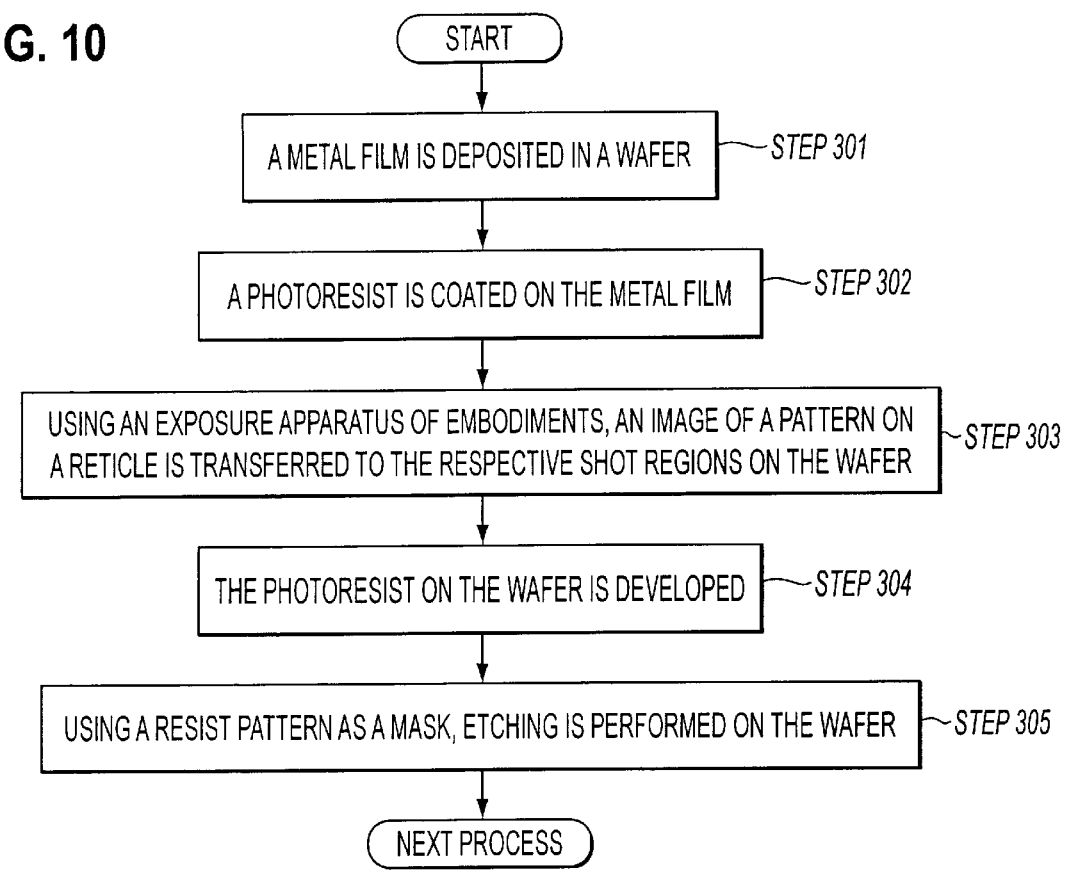
FIG. 10 is a flowchart showing one example of a method of fabricating a micro device related to embodiments of this invention.

Next, one example of an operation is explained with reference to a flowchart of FIG. 10 when a semiconductor device as a micro device is obtained by forming a predetermined circuit pattern on a wafer, using a projection exposure apparatus of the above-mentioned embodiment. First, in step 301 of FIG. 10, a metal film is deposited on one lot of wafers. In the following step 302, a photoresist is coated on the metal film on the lot of wafers. After that, in step 303, by using the projection exposure apparatus of FIG. 9 provided with the projection optical system PL in any of the first through fourth embodiments, an image of a pattern on a reticle R is sequentially exposed and transferred to the respective shot regions on the lot of wafers via the projection optical system PL.

After that, in step 304, after development of a photoresist on the lot of wafers is performed, in step 305, etching is performed as a resist pattern is used as a mask on the lot of wafers, so a circuit pattern corresponding to a pattern on the reticle R is formed in the respective shot regions on the respective wafers. After that, by further forming a circuit pattern of an upper layer or the like, a device such as a semiconductor element or the like is fabricated. According to the above-mentioned method of fabricating a semiconductor device, a semiconductor device having an extremely fine circuit pattern can be obtained with good throughput.

Furthermore, in the projection exposure apparatus of the above-mentioned embodiment, by forming a predetermined circuit pattern on a plate (glass substrate), a liquid crystal display element as a micro device can also be obtained. The following explains one example of the operation with reference to a flowchart of FIG. 11.

Figure 11:
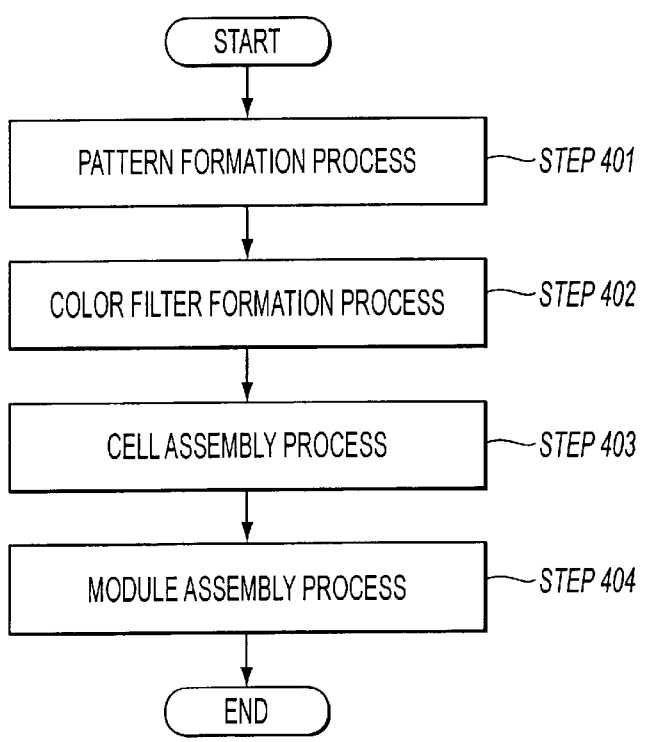
FIG. 11 is a flowchart showing one example of another method of fabricating a micro device related to embodiments of this invention.

In FIG. 11, in a pattern formation process 401, a so-called photolithography process is performed in which a pattern of a reticle is transferred and exposed onto a photosensitive substrate (glass substrate or the like coated by a resist) by using an exposure apparatus of this embodiment. By this photolithography process, a predetermined pattern including a plurality of electrodes or the like are formed on a photosensitive substrate. After that, as the exposed substrate goes through the respective processes such as a developing process, an etching process, a mask removal process, and the like, a predetermined pattern is formed on the substrate, and the substrate is transferred to the following color filter formation process 202.

Next, in the color filter formation process 402, a color filter is formed in which a plurality of groups of three dots corresponding to R (Red), G (Green), B (Blue) are arranged in a matrix. Furthermore, after the color filter formation process 402, a cell assembly process 403 is performed.

In the cell assembly process 403, a liquid crystal panel (liquid crystal cell) is assembled by using a substrate having a predetermined pattern which was obtained in the pattern formation process 401, a color filter which was obtained in the color filter formation process 402, or the like. In the cell assembly process 403, for example, liquid crystal is filled in between a substrate having a predetermined pattern which was obtained in the pattern formation process 401 and the color filter which was obtained in the color filter formation process 402, and a liquid crystal panel (liquid crystal cell) is fabricated.

After that, in a module assembly process 404, by mounting parts such as a rear light, an electric circuit which performs a display operation of the assembled liquid crystal panel (liquid crystal cell), or the like, the assembly is completed as a liquid crystal display element. According to the above-mentioned method of fabricating a liquid crystal display element, an extremely fine circuit pattern can be obtained with good throughput.

In the above-mentioned embodiment of FIG. 9, fly's eye lenses 43 and 46 are used as optical integrators (uniformizer, homogenizer) within an illumination optical system. However, a micro fly's eye lens also can be used, which is formed by etching or the like of a plurality of lens surfaces on one substrate. Furthermore, instead of the first fly's eye lens 43, a diffractive optical element can also be used which forms round-shaped, annular-shaped, or multipole-shaped irradiation fields in the far field (Fraunhofer diffractive region) by dispersing incident light by a diffraction operation. Furthermore, a diffractive optical element disclosed in, for example, U.S. Pat. No. 5,850,300 can be used. Here, in the case of using a diffractive optical element, the optical path delay optical system 41 can be omitted.

Additionally, as an optical integrator, an internal surface reflective integrator (rod integrator, light pipe, light tunnel, or the like) can also be used. In the case of using this type of internal surface reflective integrator, an emitting surface of the internal surface reflective integrator is substantially conjugate to a pattern surface of the reticle. Therefore, if this is applied to the embodiment of FIG. 9, for example, the illumination field stop (reticle blind) 11 is arranged adjacent to the exit surface of the internal surface reflective integrator, and the zoom lens 44 is formed so that the emitting surface of the first fly's eye lens 43 is substantially conjugate to the entrance surface of the internal reflective integrator.

Furthermore, in the above-mentioned first through fourth embodiments, as lens components within the projection optical system PL, calcium fluoride, barium fluoride, and lithium fluoride (LiF) are used. However, as lens components of the projection optical system, it is preferable that at least two types or more of fluoride materials selected from the group consisting of calcium fluoride ($CaF_2$, fluorite), barium fluoride ($BaF_2$), lithium fluoride (LiF), magnesium fluoride ($MgF_2$), strontium fluoride ($SrF_2$), lithium.calcium.aluminum.fluoride ($LiCaAlF_6$), and lithium.strontium.aluminum.fluoride ($LiSrAlF_6$) are used. Here, lithium.calcium.aluminum.fluoride and lithium.strontium.aluminum.fluoride are compound fluorides among the compound fluorides which are called LICAF crystals, in which micro amounts of elements such as chrome and cerium are added. Furthermore, a reflection prevention coating is provided on the lens surfaces of the respective lens components which form the projection optical system PL of the above-mentioned first through fourth embodiments. Here, as reflection prevention coatings, a first coating whose film is constituted by three layers or less, preferably, two to three layers with high transmissivity within a small incident angle range, and a second coating whose film is constituted by four layers or more with low transmissivity within a large incident angle, can be applied. When the reflection prevention coating is formed as a film on the lens surface, by sufficiently controlling moisture, in the wavelength region of $F_2$ laser, for example, a transmissivity of approximately 99.9% can be accomplished in the first coating, and, for example, a transmissivity of 99% can be accomplished in the second coating. In this embodiment, according to the incident angle of the light beam to the lens surface of the respective lens components which form the projection optical system PL, by appropriately assigning the first and second coatings (e.g., the first coating is assigned to a lens surface with a narrow incident angle range of the light beam, and the second coating is assigned to a lens surface in a wide incident angle range of the light beam), even in the case of a large numerical aperture and a large image field, transmissivity irregularity within the image field of the projection optical system and irregularity within the angle of the light beam which reaches the respective points of the image field of the projection optical system can be reduced. Furthermore, in this embodiment, this type of coating assignment is performed not only in the projection optical system but also in the illumination optical system.

Additionally, in the embodiment of FIG. 9, a prism which is formed of a birefringent material to prevent speckling can also be arranged on the incident side of the first fly's eye lens 43. A prism which prevents speckling is disclosed in, for example, U.S. Pat. No. 5,253,110. Furthermore, if the light at the wavelengths of 180 nm or less is used as an exposure wavelength, instead of a silica prism which is disclosed in U.S. Pat. No. 5,253,110, a prism which is formed of crystals of magnesium fluoride (MgF2) can be used.

A wedge prism formed of crystals of this magnesium fluoride is arranged so that the thickness gradually changes in the direction perpendicular to an optical axis of an illumination optical system. Furthermore, opposite to the wedge prism formed of crystals of magnesium fluoride, an optical path correction wedge prism is arranged so that their vertices face opposite to each other. This optical path correction wedge prism has the same vertices as the prism formed of crystals of the magnesium fluoride and formed of a light transmissive material without birefringence. By so doing, the light which is incident to a pair of prisms is aligned with the light which is emitted therefrom in the same progressing direction.

Furthermore, in the embodiment of FIG. 9, a step-and-scan method is used, but an exposure apparatus of the embodiment can be a stitching-and-slit scan exposure apparatus. When the stitching-and-slit scan method is used, by synchronously relatively scanning the reticle and the substrate in a predetermined first direction with respect to a predetermined-shaped illumination region on the reticle, exposure is performed to a first row of the region on the substrate. After that, by replacing the reticle or moving the reticle by a predetermined amount along a second direction perpendicular to a first direction of the illumination region, the substrate is horizontally shifted to a direction conjugate to the second direction of the illumination region. Furthermore, by synchronously relatively re-scanning the reticle and the substrate in the first direction with respect to a predetermined-shaped illumination region on the reticle, exposure is performed to a second row of the region on the substrate.

In this type of stitching-and-slit scan exposure apparatus, a pattern of a reticle can be exposed to a region on a substrate wider than an exposure field of a projection optical system. Furthermore, this type of stitching-and-slit scan exposure apparatus is disclosed in U.S. Pat. No. 5,477,304, Japanese Laid-Open Patent Applications 8-330220, 10-284408, or the like. Furthermore, in the above-mentioned embodiment, a batch exposure method can also be used which batch-transfers a pattern image on a reticle with respect to a predetermined shot region on a substrate.

In addition, in the embodiment of FIG. 9, a wafer stage which holds a wafer as a workpiece (photosensitive substrate) was arranged. However, for example, as disclosed in Japanese Laid-Open Patent Applications 5-175098, 10-163097, 10-163098, 10-163099, 10-214783, or the like, a structure is acceptable which arranges two sets of wafer stages.

Furthermore, this invention can be applied to not only an exposure apparatus which is used when a semiconductor element is fabricated, but also to an exposure apparatus which transfers a device pattern onto a glass plate that is used when a display including a liquid crystal display element is fabricated, an exposure apparatus which transfers a device pattern onto a ceramic wafer that is used when a thin film magnetic head is fabricated, an exposure apparatus that is used when an imaging element (CCD or the like) is fabricated, or the like. Furthermore, in order to fabricate a reticle or a mask, this invention can also be applied to an exposure apparatus which transfers a circuit pattern onto a glass substrate, a silicon wafer, or the like.

Preferred embodiments according to this invention were explained with reference to the attached drawings. However, this invention is not limited to the above-mentioned embodiments. It is clear that those skilled in the art can accomplish various modifications or changes within the technical scope as set forth in the claims, and it is understood that these are within a technical scope of this invention.

Thus, in the projection optical system related to the above-mentioned embodiments of this invention explained in detail, chromatic aberration can be corrected well, having a short glass path and a low number of lens surfaces. By so doing, the burden can be reduced with respect to the light source. Furthermore, in the projection exposure apparatus according to the embodiments of this invention, an image of a pattern of a mask which is extremely fine can be projection exposed onto a workpiece well, and a fine circuit pattern can be formed at high resolution.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A dioptric projection optical system which projects an image of a first surface onto a second surface, comprising:
    a first lens group having a negative refractive power and arranged in an optical path between the first surface and the second surface,
    a second lens group having a positive refractive power and arranged in an optical path between the first lens group and the second surface,
    a third lens group having a negative refractive power and arranged in an optical path between the second lens group and the second surface,
    a fourth lens group having an aperture stop and arranged in an optical path between the third lens group and the second surface, and
    a fifth lens group having a positive refractive power and arranged in an optical path between the fourth lens group and the second surface,
    wherein lens components belonging to the dioptric projection optical system are formed of at least two types of fluorides, and
    wherein a clear aperture of a light beam in the projection optical system is at a relative maximum within the second lens group, at a minimum within the third lens group, and at a relative maximum within the third, fourth, or fifth lens group, and has only one significant minimum between the first surface and the second surface.

2. The projection optical system as set forth in claim 1, wherein all lens components within the dioptric projection optical system are formed of the at least two types of fluorides.

3. The projection optical system as set forth in claim 2; wherein when an clear aperture of a surface having a maximum clear aperture within the second lens group is Mx2 and an clear aperture of a surface having a minimum clear aperture within the third lens group is Mn3, the following condition is satisfied:

1.7<Mx2/Mn3<4.

4. The projection optical system as set forth in claim 1, wherein when an clear aperture of a surface having a maximum clear aperture within the second lens group is Mx2 and an clear aperture of a surface having a minimum clear aperture within the third lens group is Mn3, the following condition is satisfied:

1.7<Mx2/Mn3<4.

5. The projection optical system as set forth in claim 1, wherein when a distance between a surface having a minimum clear aperture within the third lens group and the stop surface is Ls and a distance between the first surface and the second surface is Lt, the following condition is satisfied:

0.18<Ls/Lt<0.48.

6. The projection optical system as set forth in claim 1, wherein when the clear aperture is H in at least two negative lenses within the fourth lens group and a diagonal length of an image field is D, the following condition is satisfied:

7<H/D<18 and when a composite refractive power of the at least two negative lenses which satisfy the above-mentioned condition is P, the following is satisfied:

0.003<|P|<0.02.

7. The projection optical system as set forth in claim 1, wherein when the clear aperture of the surface having the maximum clear aperture is Mx4 within the fourth lens group and the clear aperture of the surface having the minimum clear aperture is Mn4, the following condition is satisfied:

0.77<Mn4/Mx4<1.

8. The projection optical system as set forth in claim 1, wherein when an F number of the respective lenses which form the third lens group is FNi, the following condition is satisfied:

0.8<|FNi|.

9. A dioptric projection optical system which projects an image of a first surface onto a second surface, comprising:
  a first lens group having a negative refractive power and arranged in an optical path between the first surface and the second surface,
  a second lens group having a positive refractive power and arranged in an optical path between the first lens group and the second surface,
  a third lens group having a negative refractive power and arranged in an optical path between the second lens group and the second surface,
  a fourth lens group having an aperture stop and arranged in an optical path between the third lens group and the second surface, and
  a fifth lens group having a positive refractive power and arranged in an optical path between the fourth lens group and the second surface,
  wherein an clear aperture of a light beam in the projection optical system monotonically increases within the first lens group in a direction from the first surface side to the second surface side, goes from an increased size to a decreased size within the second lens group, goes from a decreased size to an increased size within the third lens group, and monotonically decreases within the fifth lens group, and
  when the clear aperture of a surface having a maximum clear aperture of the second lens group is Mx2 and the clear aperture of a surface having a minimum clear aperture within the third lens group is Mn3, the following condition is satisfied:

1.7<Mx2/Mn3<4.

10. The projection optical system as set forth in claim 9, wherein the projection optical system includes lens components formed of at least two types of fluorides.

11. The projection optical system as set forth in claim 9, wherein at least two sets of positive and negative lenses are adjacent to each other within the fourth lens group, and the positive and negative lenses are formed of different fluoride materials.

12. The projection optical system as set forth in claim 11, wherein the fluoride is a material selected from the group consisting of calcium fluoride, barium fluoride, lithium fluoride, magnesium fluoride, strontium fluoride, lithium.calcium.aluminum.fluoride, and lithium.strontium.aluminum.fluoride.

13. The projection optical system as set forth in claim 11, wherein the positive lenses are formed of calcium fluoride, and the negative lenses are formed of barium fluoride.

14. The projection optical system as set forth in claim 11, wherein the positive lenses are formed of lithium fluoride, and the negative lenses are formed of calcium fluoride.

15. The projection optical system as set forth in claim 9, wherein when a distance between a surface having a minimum clear aperture within the third lens group and the stop surface is Ls and a distance between the first surface and the second surface is Lt, the following condition is satisfied:

0.18<Ls/Lt<0.48.

16. The projection optical system as set forth in claim 9, wherein when the clear aperture is H in at least two negative lenses within the fourth lens group and a diagonal length of an image field is D, the following condition is satisfied:

7<H/D<18 and when a composite refractive power of the at least two negative lenses satisfy the above equation is P, the following condition is satisfied:

0.003<|P|<0.02.

17. The projection optical system as set forth in claim 9, wherein when the clear aperture of a surface having the maximum clear aperture within the fourth lens group is Mx4 and the clear aperture of a surface having the minimum clear aperture is Mn4, the following condition is satisfied:

0.77<Mn4/Mx4<1.

18. The projection optical system as set forth in claim 9, wherein when F numbers of the respective lenses which form the third lens group are FNi, the following condition is satisfied:

0.8<|FNi|.

19. A projection exposure apparatus which projection exposes an image of a pattern provided in a projection negative plate onto a workpiece, comprising:

a light source which supplies exposure light;

an illumination optical system which guides exposure light from the light source to the pattern on the projection negative plate; and the projection optical system as set forth in claim 1;

wherein the projection negative plate is arranged at the first surface, and the workpiece is arranged at the second surface.

20. A projection exposure apparatus which projection exposes an image of a pattern provided in a projection negative plate onto a workpiece, comprising:

a light source which supplies exposure light;

an illumination optical system which guides exposure light from the light source to the pattern on the projection negative plate; and the projection optical system as set forth in claim 9;

wherein the projection negative plate is arranged at the first surface and the workpiece is arranged at the second surface.

21. A projection exposure method which projection exposes an image of a pattern provided in a projection negative plate onto a workpiece, comprising the steps of:

supplying exposure light;

guiding the exposure light to the pattern on the projection negative plate; and projecting an image of the pattern of the projection negative plate onto the workpiece arranged at the second surface, using the projection optical system as set forth in claim 1.

22. A projection exposure method which projection exposes an image of a pattern arranged in a projection negative plate onto a workpiece, comprising the steps of:

supplying exposure light;

guiding the exposure light to the pattern on the projection negative plate; and projecting an image of the pattern of the projection negative plate arranged at the first surface onto the workpiece arranged at the second surface, using the projection optical system as set forth in claim 9.

* * * * *